United States Patent
Hayashi

(10) Patent No.: US 9,496,307 B2
(45) Date of Patent: *Nov. 15, 2016

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Toshihiko Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,476

(22) Filed: Sep. 28, 2015

(65) Prior Publication Data

US 2016/0020240 A1    Jan. 21, 2016

Related U.S. Application Data

(60) Continuation of application No. 14/168,524, filed on Jan. 30, 2014, now Pat. No. 9,171,875, which is a division of application No. 13/362,758, filed on Jan. 31, 2012, now Pat. No. 8,669,602.

(30) Foreign Application Priority Data

Feb. 8, 2011    (JP) ................................. 2011-024954

(51) Int. Cl.
  *H01L 31/062*    (2012.01)
  *H01L 27/146*    (2006.01)
(52) U.S. Cl.
  CPC ..... *H01L 27/14636* (2013.01); *H01L 27/1461* (2013.01); *H01L 27/1464* (2013.01); *H01L27/1469* (2013.01); *H01L 27/14623* (2013.01); *H01L 27/14625* (2013.01); *H01L 27/14634* (2013.01); *H01L 27/14685* (2013.01); *H01L 27/14645* (2013.01)

(58) Field of Classification Search
  CPC .......... H01L 27/1469; H01L 27/1461; H01L 27/14623; H01L 27/14634; H01L 27/1464
  USPC .......................... 257/292, 435, 447, E31.127
  See application file for complete search history.

(56) References Cited

U.S. PATENT DOCUMENTS

| | | | | |
|---|---|---|---|---|
| 8,669,602 B2 * | 3/2014 | Hayashi | .............. | H01L 27/1461 257/292 |
| 9,171,875 B2 * | 10/2015 | Hayashi | .............. | H01L 27/1461 |

(Continued)

FOREIGN PATENT DOCUMENTS

| | | |
|---|---|---|
| JP | 2006-049361 | 2/2006 |
| JP | 2010-219339 A | 9/2010 |

(Continued)

OTHER PUBLICATIONS

Japanese Office Action issued Oct. 21, 2014, for corresponding Japanese Application No. 2011-024954.

*Primary Examiner* — Tan N Tran
(74) *Attorney, Agent, or Firm* — Michael Best & Friedrich LLP

(57) ABSTRACT

Disclosed herein is a solid-state imaging device including: a laminated semiconductor chip configured to be obtained by bonding two or more semiconductor chip sections to each other and be obtained by bonding at least a first semiconductor chip section in which a pixel array and a multilayer wiring layer are formed and a second semiconductor chip section in which a logic circuit and a multilayer wiring layer are formed to each other in such a manner that the multilayer wiring layers are opposed to each other and are electrically connected to each other; and a light blocking layer configured to be formed by an electrically-conductive film of the same layer as a layer of a connected interconnect of one or both of the first and second semiconductor chip sections near bonding between the first and second semiconductor chip sections. The solid-state imaging device is a back-illuminated solid-state imaging device.

19 Claims, 18 Drawing Sheets

(56) References Cited

U.S. PATENT DOCUMENTS

2009/0305499 A1    12/2009   Gambino et al.
2010/0238331 A1    9/2010   Umebayashi et al.

FOREIGN PATENT DOCUMENTS

JP          2010-245506 A    10/2010
WO    WO-2006/129762    12/2006

\* cited by examiner

US 9,496,307 B2

SOLID-STATE IMAGING DEVICE, MANUFACTURING METHOD THEREOF, AND ELECTRONIC APPARATUS

CROSS REFERENCE TO RELATED APPLICATIONS

The present application is a Continuation of application Ser. No. 14/168,524, filed Jan. 30, 2014, which is a Divisional of application Ser. No. 13/362,758, filed Jan. 31, 2012, now U.S. Pat. No. 8,669,602, issued Mar. 11, 2014, and claims priority to Japanese Patent Application JP 2011-024954 filed in the Japanese Patent Office on Feb. 8, 2011, the entire contents of which is hereby incorporated by reference.

BACKGROUND

The present disclosure relates to a solid-state imaging device, a manufacturing method thereof, and an electronic apparatus including a solid-state imaging device, such as a camera.

The CMOS (Complementary Metal Oxide Semiconductor) solid-state imaging device is known as a solid-state imaging device and this CMOS solid-state imaging device is widely used in digital still cameras, digital video camcorders, etc. In recent years, as the solid-state imaging device mounted in a mobile apparatus such as a cellular phone equipped with a camera and a personal digital assistant (PDA), the CMOS solid-state imaging device, whose supply voltage is low, is frequently used in view of the power consumption and so forth.

In the CMOS solid-state imaging device, the unit pixel is formed with a photodiode serving as a photoelectric converter and plural pixel transistors. The CMOS solid-state imaging device has a pixel array (pixel area) in which the plural unit pixels are arranged in a two-dimensional array manner and a peripheral circuit area. The plural pixel transistors are formed of MOS transistors and are composed of three transistors, i.e. a transfer transistor, a reset transistor, and an amplification transistor, or four transistors further including a selection transistor in addition to these three transistors.

As such a CMOS solid-state imaging device, there have been proposed various related-art solid-state imaging devices configured as one device by electrically connecting a semiconductor chip in which the pixel array obtained by arranging plural pixels is formed to a semiconductor chip in which a logic circuit to execute signal processing is formed. For example, Japanese Patent Laid-open No. 2006-49361 discloses a semiconductor module obtained by connecting a back-illuminated image sensor chip having a micro-pad for each pixel cell to a signal processing chip having a signal processing circuit and a micro-pad by a micro-bump.

WO2006/129762 discloses a semiconductor image sensor module obtained by stacking a first semiconductor chip including an image sensor, a second semiconductor chip including an analog/digital converter array, and a third semiconductor chip including a memory element array. The first semiconductor chip is connected to the second semiconductor chip via a bump as an electrically-conductive connecting conductor. The second semiconductor chip is connected to the third semiconductor chip by a penetrating contact that penetrates the second semiconductor chip.

SUMMARY

The present applicant has proposed the following solid-state imaging device. Specifically, the solid-state imaging device is obtained by bonding a semiconductor chip section including a pixel array and a semiconductor chip section including a logic circuit to each other. The solid-state imaging device is allowed to achieve higher performance so that the respective semiconductor chip sections can sufficiently exert their performance, and is allowed to achieve higher mass-productivity and cost reduction. For manufacturing of this solid-state imaging device, the first semiconductor chip section including the pixel array and the second semiconductor chip section including the logic circuit, both of which are in a semi-product state, are bonded to each other. Then, the first semiconductor chip section is processed into a thin film form and thereafter the pixel array is connected to the logic circuit. The connection is established by forming a connecting interconnect composed of: a connecting conductor connected to the requisite interconnect of the first semiconductor chip section; a penetrating connecting conductor that penetrates the first semiconductor chip section and is connected to the requisite interconnect of the second semiconductor chip section; and a coupling conductor that links both connecting conductors. Thereafter, this component obtained by the bonding is processed into a finished-product state and turned to a chip so as to be configured as a back-illuminated solid-state imaging device.

Meanwhile, as a new technique for the above-described solid-state imaging device obtained by bonding the first semiconductor chip section and the second semiconductor chip section, there has been devised a method in which the connection is established not by the electrical connecting method using the penetrating connecting conductor but by guiding copper (Cu) electrodes to the surfaces of both semiconductor chip sections.

FIG. 22 shows a solid-state imaging device as one example of this technique. A back-illuminated CMOS solid-state imaging device 121 of the present example is configured as one device by bonding a first semiconductor chip section 122 and a second semiconductor chip section 123. In the first semiconductor chip section 122, a pixel array 124 composed of an effective pixel area 125 and an optical black area 126 that outputs an optical reference black level is formed. In the second semiconductor chip section 123, a logic circuit 127 serving as the peripheral circuit is formed.

In the first semiconductor chip section 122, the pixel array 124 in which plural pixels each including a photodiode PD serving as a photoelectric converter and plural pixel transistors Tr1 and Tr2 are two-dimensionally arranged in a matrix is formed in a first semiconductor substrate 131 formed of silicon processed into a thin film form. On the side of a front surface 131a of the semiconductor substrate 131, a multilayer wiring layer 134 is formed in which interconnects 133 [133a to 133d] and 142 formed of metals M1 to M5 of plural layers, e.g. five layers in this example, are disposed by the intermediary of an interlayer insulating film 112. Copper (Cu) interconnects are used as the interconnects 133 and 142. On the back surface side of the semiconductor substrate 131, a light blocking film 136 covering the area over the optical black area 126 is formed by the intermediary of an insulating film 135. Furthermore, a color filter 138 and an on-chip lens 139 are formed by the intermediary of a planarizing film 130.

In FIG. 22, the pixel transistors Tr1 and Tr2 are shown as representatives of the plural pixel transistors. Although FIG. 22 schematically shows the pixels of the pixel array 124, the details of one pixel are shown in FIG. 23. In the first semiconductor chip 122, the photodiode PD is formed in the semiconductor substrate 131 processed into a thin film form. The photodiode PD has e.g. an n-type semiconductor region 135 and a p-type semiconductor region 136 on the substrate surface side. Over the substrate surface to configure the pixels, gate electrodes 137 are formed by the intermediary of gate insulating films and the pixel transistors Tr1 and Tr2 are each formed by the gate electrode 137 and a pair of source and drain regions 138. The pixel transistor Tr1 adjacent to the photodiode PD is equivalent to a floating diffusion FD. Each unit pixel is isolated by an element isolation region 139.

In the multilayer wiring layer 134 of the first semiconductor chip section 122, connection is established via electrically-conductive vias 141 between the corresponding pixel transistor and the interconnect 133 and between the interconnects 133 of upper and lower layers adjacent to each other. Furthermore, the connecting interconnect 142 formed of the fifth-layer metal M5 is so formed as to face the bonding surface to the second semiconductor chip section 123. The connecting interconnect 142 is connected to the requisite interconnect 133d formed of the fourth-layer metal M4 via the electrically-conductive vias 141.

In the second semiconductor chip section 123, the logic circuit 127 serving as the peripheral circuit is formed in the area serving as each chip section in a second semiconductor substrate 143 formed of silicon. The logic circuit 127 is formed by plural MOS transistors Tr11 to Tr14 including a CMOS transistor. Over the front surface side of the semiconductor substrate 143, a multilayer wiring layer 147 is formed in which interconnects 145 [145a to 145c] and a connecting interconnect 146 formed of metals M11 to M14 of plural layers, e.g. four layers in this example, are disposed by the intermediary of an interlayer insulating film 144. Copper (Cu) interconnects are used as the interconnects 145.

In FIG. 22, the MOS transistors Tr11 to Tr14 are shown as representatives of the plural MOS transistors of the logic circuit 127. Although FIG. 22 schematically shows the MOS transistors Tr11 to Tr14, the details of e.g. the MOS transistors Tr11 and Tr12 are shown in FIG. 24. In the second semiconductor chip section 123, each of the MOS transistors Tr11 and Tr12 is so formed as to have a pair of source and drain regions 149 and a gate electrode 151 formed by the intermediary of a gate insulating film in a semiconductor well region on the front surface side of the semiconductor substrate 143. Each of the MOS transistors Tr11 and Tr12 is isolated by an element isolation region 152.

In the multilayer wiring layer 147 of the second semiconductor chip section 123, connection is established via electrically-conductive vias 153 between the MOS transistors Tr11 to Tr14 and the interconnect 145 and between the interconnects 145 of upper and lower layers adjacent to each other. Furthermore, the connecting interconnect 146 formed of the fourth-layer metal M14 is so formed as to face the bonding surface to the first semiconductor chip section 122. The connecting interconnect 146 is connected to the requisite interconnect 145c formed of the third-layer metal M13 via the electrically-conductive via 153.

The first semiconductor chip section 122 and the second semiconductor chip section 123 are electrically connected to each other in such a manner that their respective multilayer wiring layers 134 and 147 are opposed to each other and the connecting interconnects 142 and 146 facing the bonding surface are bonded directly to each other. An insulating film 154 near the bonding is formed of a Cu diffusion barrier insulating film for preventing Cu diffusion of the Cu interconnect.

By the way, it has turned out that, in the above-described solid-state imaging device 121, light emission due to hot carriers from the MOS transistor in the logic circuit 127 is incident on the pixel array side and this light incidence causes dark current and random noise. Therefore, a light blocking layer needs to be provided between the first semiconductor chip section 122, in which the pixel array is formed, and the second semiconductor chip section 123, in which the logic circuit is formed. In FIG. 22, in the multilayer wiring layer 134 of the first semiconductor chip section 122, a light blocking layer 155 is formed separately from the interconnects 133.

To form the light blocking layer 155 between the first and second semiconductor chip sections 122 and 123, it is necessary to form the light blocking layer 155, and to carry out electrical isolation and interconnect forming for wiring between the first and second semiconductor chip sections, so that the number of steps becomes large. Furthermore, the light blocking layer 155 needs to have a sufficiently-large film thickness to attenuate light. The existence of this light blocking layer 155 increases the thickness of the whole semiconductor chip obtained by bonding the first and second semiconductor chip sections 122 and 123 and extends the distance of the electrical interconnect forming. This increases the technical difficulty in the interconnect forming and causes problems such as lowering of the manufacturing yield of the solid-state imaging device.

The present disclosure has been made in view of the above circumstances and provides a solid-state imaging device and a manufacturing method thereof that suppress the thickness of the whole semiconductor chip, suppress the adverse effects of light emission due to hot carriers from a transistor, and allow reduction in the number of steps.

The present disclosure also provides an electronic apparatus that can be applied to e.g. a camera including such a solid-state imaging device.

According to one embodiment of the present disclosure, there is provided a solid-state imaging device including: a laminated semiconductor chip configured to be obtained by bonding two or more semiconductor chip sections to each other and be obtained by bonding at least a first semiconductor chip section in which a pixel array and a multilayer wiring layer are formed and a second semiconductor chip section in which a logic circuit and a multilayer wiring layer are formed to each other in such a manner that the multilayer wiring layers are opposed to each other and are electrically connected to each other; and a light blocking layer configured to be formed by an electrically-conductive film of the same layer as a layer of a connected interconnect of one or both of the first and second semiconductor chip sections near bonding between the first and second semiconductor chip sections. The solid-state imaging device is configured as a back-illuminated solid-state imaging device.

In the solid-state imaging device according to the embodiment of the present disclosure, the light blocking layer is formed by the electrically-conductive film of the same layer as that of the connected interconnect of one or both of the first and second semiconductor chip sections near the bonding between the first and second semiconductor chip sections. Thus, emitted light due to hot carriers from a transistor of the logic circuit is prevented by the light blocking layer and the incidence thereof on the pixel array side is suppressed. Furthermore, the thickness of the whole semiconductor chip after the bonding is also suppressed.

According to another embodiment of the present disclosure, there is provided a manufacturing method of a solid-state imaging device. The method includes: forming at least a pixel array and a multilayer wiring layer in an area to serve as a first semiconductor chip section in a first semiconductor wafer; forming at least a logic circuit and a multilayer wiring layer in an area to serve as a second semiconductor chip section in a second semiconductor wafer. The method also includes forming a light blocking layer by an electrically-conductive film of the same layer as a layer of a connected interconnect in the multilayer wiring layer of one or both of the first semiconductor wafer and the second semiconductor wafer. The method further includes: bonding two or more semiconductor wafers including at least the first and second semiconductor wafers in such a manner that the multilayer wiring layers of the first semiconductor wafer and the second semiconductor wafer are opposed to each other and interconnects of both wafers are electrically connected to each other; processing the first semiconductor wafer into a thin film form; and processing the bonded semiconductor wafers into a chip.

In the manufacturing method of a solid-state imaging device according to the embodiment of the present disclosure, the light blocking layer formed by the electrically-conductive film of the same layer as that of the connected interconnect is formed in the multilayer wiring layer of one or both of the first semiconductor wafer and the second semiconductor wafer. Furthermore, the first and second semiconductor wafers are so bonded to each other that their respective multilayer wiring layers are opposed to each other and the interconnects of both wafers are electrically connected to each other. This enables manufacturing a solid-state imaging device having the following features. Specifically, the thickness of the whole semiconductor chip after the bonding is suppressed. In addition, emitted light due to hot carriers from a transistor of the logic circuit is blocked by the light blocking layer and the incidence thereof on the pixel array side is suppressed.

According to further embodiment of the present disclosure, there is provided an electronic apparatus including a solid-state imaging device, an optical system that guides incident light to a photoelectric converter of the solid-state imaging device, and a signal processing circuit that processes an output signal of the solid-state imaging device. The solid-state imaging device is configured by the solid-state imaging device according to the above-described embodiment of the present disclosure.

The electronic apparatus according to the embodiment of the present disclosure includes the solid-state imaging device having the above-described configuration as its solid-state imaging device. Therefore, in the solid-state imaging device, the thickness of the whole semiconductor chip after the bonding is suppressed. In addition, emitted light due to hot carriers from a transistor of the logic circuit is blocked by the light blocking layer and the incidence thereof on the pixel array side is suppressed.

The solid-state imaging device and the manufacturing method thereof according to the embodiments of the present disclosure can suppress the thickness of the whole semiconductor chip and suppress the adverse effects of light emission due to hot carriers from a transistor. Furthermore, they enable reduction in the number of manufacturing steps.

The electronic apparatus according to the embodiment of the present disclosure includes a solid-state imaging device based on bonded chips in which the adverse effects of light emission due to hot carriers from a transistor are suppressed. This can provide an electronic apparatus such as a high-quality camera.

DETAILED DESCRIPTION OF THE PREFERRED EMBODIMENTS

Modes for carrying out the technique of the present disclosure (hereinafter, referred to as the embodiments) will be described below. The order of the description is as follows.
1. Schematic Configuration Example of CMOS Solid-state Imaging Device
2. First Embodiment (configuration example of solid-state imaging device and manufacturing method example thereof)
3. Second Embodiment (configuration example of solid-state imaging device and manufacturing method example thereof)
4. Third Embodiment (configuration example of electronic apparatus)

1. Schematic Configuration Example of CMOS Solid-State Imaging Device

Figure 1:
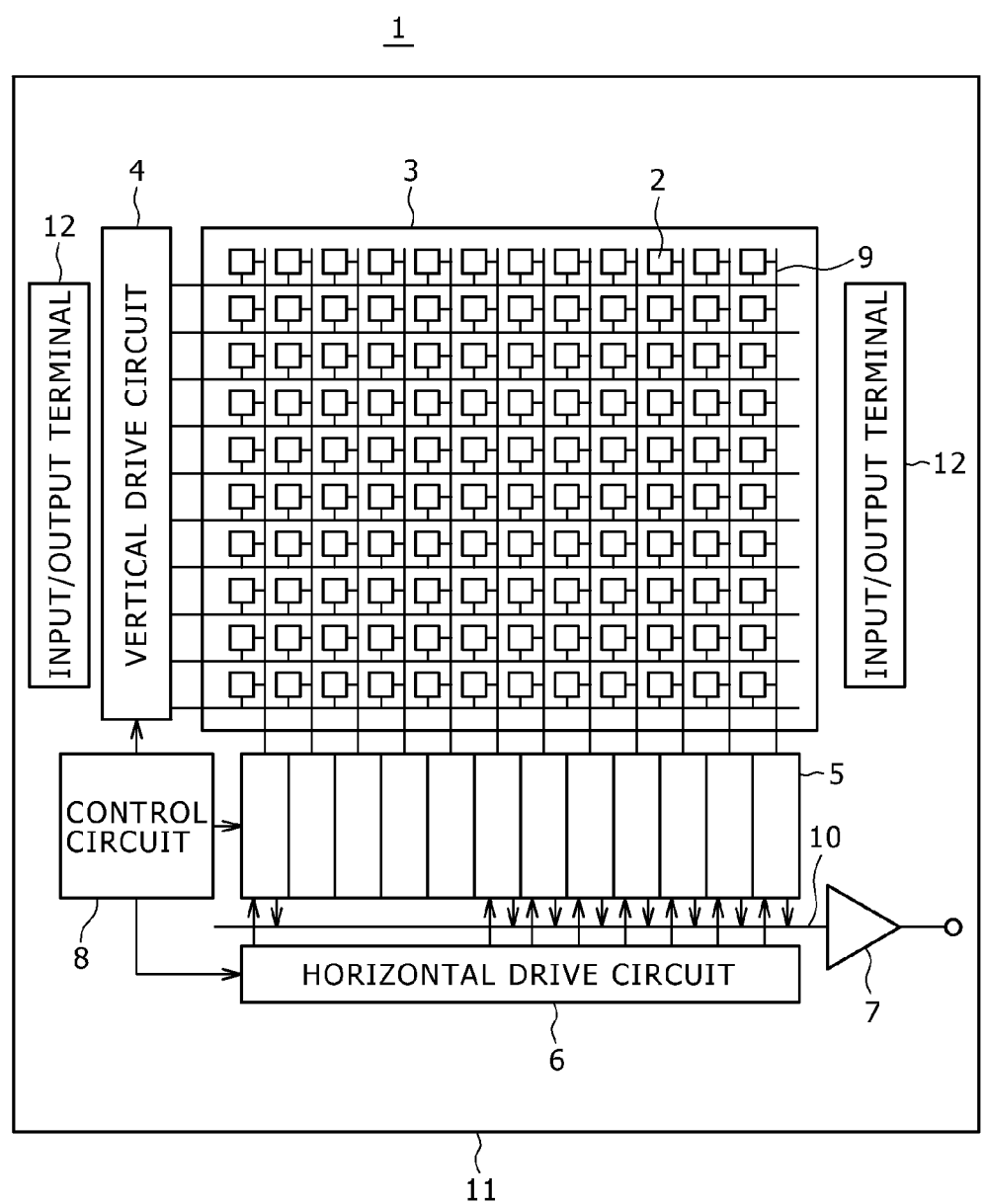
FIG. 1 is a schematic configuration diagram showing one example of a CMOS solid-state imaging device applied to an embodiment of the present disclosure.

FIG. 1 shows the schematic configuration of a CMOS solid-state imaging device applied to a semiconductor device of one embodiment of the present disclosure. This CMOS solid-state imaging device is applied to solid-state imaging devices of the respective embodiments. As shown in FIG. 1, a solid-state imaging device 1 of the present example has a pixel array (so-called pixel area) 3 in which plural pixels 2 each including a photoelectric converter are regularly arranged in a two-dimensional array manner and a peripheral circuit section over a semiconductor substrate 11, e.g. a silicon substrate. The pixel 2 has e.g. a photodiode serving as the photoelectric converter and plural pixel transistors (so-called MOS (Metal-Oxide Semiconductor) transistor). The plural pixel transistors can be configured by e.g. three transistors, i.e. a transfer transistor, a reset transistor, and an amplification transistor. Alternatively, it is also possible to add a selection transistor to configure the pixel transistors by four transistors. The equivalent circuit of the unit pixel is similar to a normal circuit and therefore detailed description thereof is omitted. The pixel 2 can be configured as one unit pixel. It is also possible for the pixel 2 to have a sharing pixel structure. This pixel sharing structure is composed of plural photodiodes, plural transfer transistors, shared one floating diffusion, and a shared respective one of the other pixel transistors. That is, in the sharing pixel, the photodiodes and the transfer transistors of plural unit pixels share a respective one of the other pixel transistors.

The peripheral circuit section has a vertical drive circuit 4, column signal processing circuits 5, a horizontal drive circuit 6, an output circuit 7, a control circuit 8, and so forth.

The control circuit 8 receives an input clock and data to order the operation mode and so forth, and outputs data of internal information of the solid-state imaging device and so forth. Specifically, the control circuit 8 generates a clock signal and a control signal serving as the basis of the operation of the vertical drive circuit 4, the column signal processing circuits 5, the horizontal drive circuit 6, and so forth based on a vertical synchronizing signal, a horizontal synchronizing signal, and a master clock. The control circuit 8 inputs these signals to the vertical drive circuit 4, the column signal processing circuits 5, the horizontal drive circuit 6, and so forth.

The vertical drive circuit 4 is configured with e.g. a shift register. The vertical drive circuit 4 selects a pixel drive interconnect and supplies a pulse for driving the pixel to the selected pixel drive interconnect to drive the pixels on a row-by-row basis. Specifically, the vertical drive circuit 4 performs selective scanning of the respective pixels 2 of the pixel array 3 on a row-by-row basis sequentially in the vertical direction and supplies a pixel signal based on a signal charge generated depending on the amount of received light in e.g. the photodiode serving as the photoelectric converter of each of the pixel 2 to the column signal processing circuits 5 via vertical signal lines 9.

The column signal processing circuits 5 are disposed for each column of the pixels 2 for example and execute signal processing such as noise removal for signals output from the pixels 2 on one row on each pixel column basis. Specifically, the column signal processing circuits 5 execute signal processing such as CDS (Correlated Double Sampling) for removing fixed pattern noise specific to the pixel 2, signal amplification, and AD (Analog-to-Digital) conversion. At the output stage of the column signal processing circuits 5, a horizontal selection switch (not shown) is so provided as to be connected to a horizontal signal line 10.

The horizontal drive circuit 6 is configured with e.g. a shift register. The horizontal drive circuit 6 sequentially outputs a horizontal scanning pulse to thereby select each of the column signal processing circuits 5 in turn and make the pixel signal be output from each of the column signal processing circuits 5 to the horizontal signal line 10.

The output circuit 7 executes signal processing for the signal sequentially supplied from each of the column signal processing circuits 5 via the horizontal signal line 10 and outputs the resulting signal. For example, the output circuit 7 performs only buffering in some cases, and executes black level adjustment, column variation correction, various kinds of digital signal processing, etc. in other cases. Input/output terminals 12 exchange signals with the external.

Figure 2A:
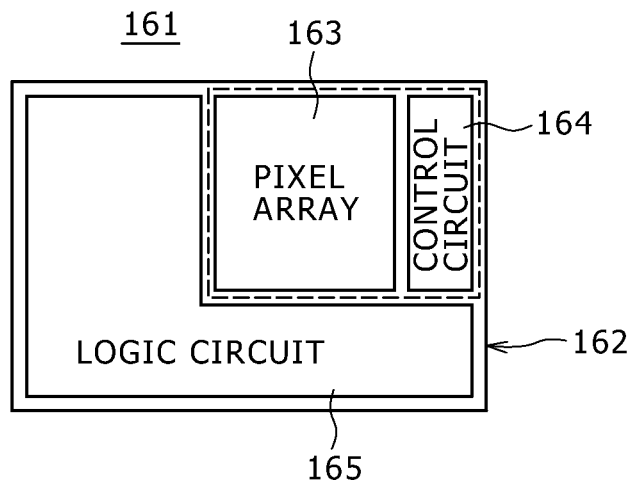
FIGS. 2A to 2C are schematic diagrams of solid-state imaging devices according to embodiments of the present disclosure and a solid-state imaging device according to a related-art example.
Figure 2B:
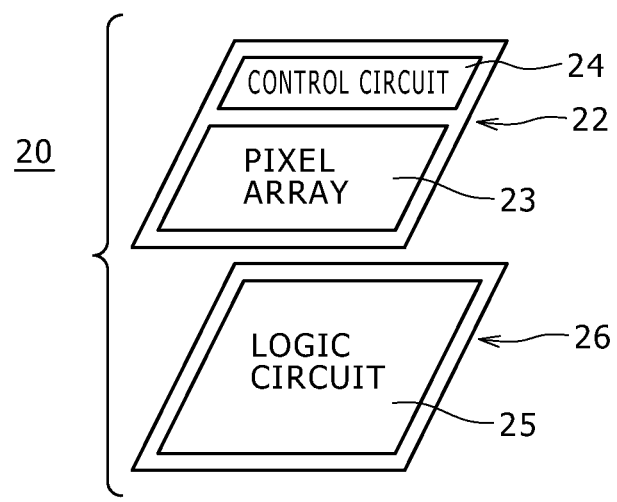
Figure 2C:
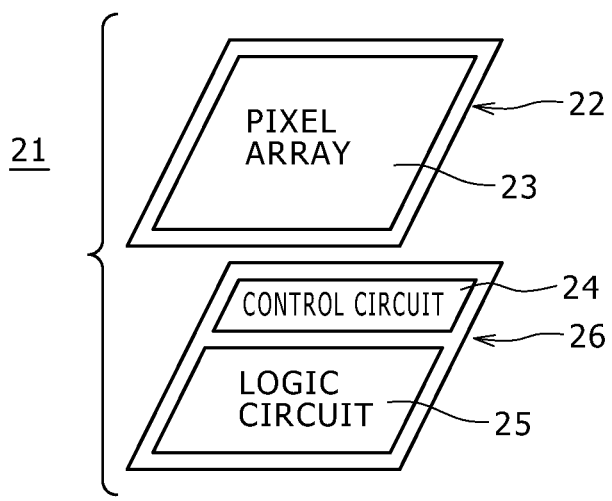

FIGS. 2A to 2C show the basic schematic configurations of a related-art CMOS solid-state imaging device and CMOS solid-state imaging devices according to embodiments of the present disclosure. As shown in FIG. 2A, a related-art CMOS solid-state imaging device 161 is configured by mounting a pixel array 163, a control circuit 164, and a logic circuit 165 for signal processing in one semiconductor chip 162. Normally an image sensor 166 is configured by the pixel array 163 and the control circuit 164. In contrast, as shown in FIG. 2B, in a CMOS solid-state imaging device 20 according to one embodiment of the present disclosure, a pixel array 23 and a control circuit 24 are mounted in a first semiconductor chip section 22 and a logic circuit 25 including a signal processing circuit for signal processing is mounted in a second semiconductor chip section 26. The first and second semiconductor chip sections 22 and 26 are electrically connected to each other to configure the CMOS solid-state imaging device 20 as one semiconductor chip. As shown in FIG. 2C, in a CMOS solid-state imaging device 21 according to another embodiment of the present disclosure, the pixel array 23 is mounted in the first semiconductor chip section 22 and the control circuit 24 and the logic circuit 25 including the signal processing circuit are mounted in the second semiconductor chip section 26. The first and second semiconductor chip sections 22 and 26 are electrically connected to each other to configure the CMOS solid-state imaging device 21 as one semiconductor chip.

It is also possible to configure a CMOS solid-state imaging device by bonding three or more semiconductor chip sections to each other depending on the configuration of the CMOS solid-state imaging device, although not shown in the diagram. For example, it is also possible to configure a CMOS solid-state imaging device made as one chip by adding a semiconductor chip section including a memory element array, a semiconductor chip section including another circuit element, and so forth besides the above-described first and second semiconductor chip sections and bonding three or more semiconductor chip sections to each other.

2. First Embodiment

Configuration Example of Solid-State Imaging Device

Figure 3:
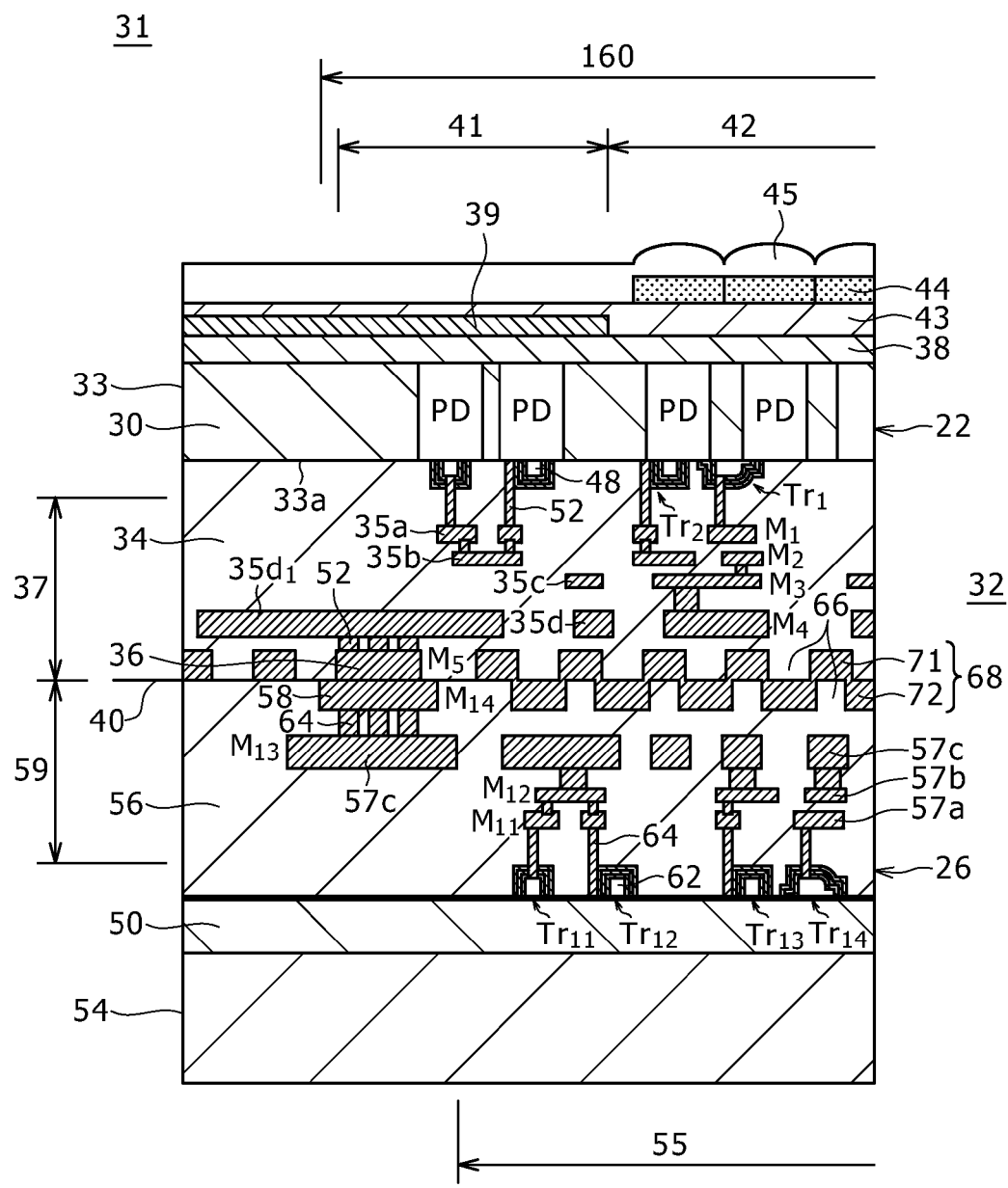
FIG. 3 is a schematic configuration diagram of a major part, showing a solid-state imaging device according to a first embodiment of the present disclosure.

FIG. 3 shows a solid-state imaging device according to one embodiment of the present disclosure, specifically a back-illuminated CMOS solid-state imaging device according to a first embodiment of the present disclosure. A solid-state imaging device 31 according to the first embodiment has a laminated semiconductor chip 32 obtained by bonding the first semiconductor chip section 22 in which the pixel array 23 and the control circuit 24 are formed and the second semiconductor chip section 26 in which the logic circuit 25 is formed, similar to those shown in FIG. 2B. The first semiconductor chip section 22 is bonded to the second semiconductor chip section 26 in such a manner that their respective multilayer wiring layers to be described later are opposed to each other and that connecting interconnects are bonded directly to each other.

In the first semiconductor chip section 22, a pixel array 160 in which plural pixels each including a photodiode PD serving as the photoelectric converter and plural pixel transistors Tr1 and Tr2 are two-dimensionally arranged in a matrix is formed in a first semiconductor substrate 33 formed of silicon processed into a thin film form. Furthermore, plural MOS transistors configuring the control circuit 24 are formed on the semiconductor substrate 33 although not shown in the diagram. On the side of a front surface 33a of the semiconductor substrate 33, a multilayer wiring layer 37 is formed in which interconnects 35 [35a to 35d] and 36 formed of metals M1 to M5 of plural layers, e.g. five layers in this example, are disposed by the intermediary of an interlayer insulating film 34. Copper (Cu) interconnects formed by a dual damascene method are used as the interconnects 35 and 36. On the back surface side of the semiconductor substrate 33, a light blocking film 39 covering the area over an optical black area 41 is formed by the intermediary of an insulating film 38. Furthermore, a color filter 44 and an on-chip lens 45 are formed over an effective pixel area 42 by the intermediary of a planarizing film 43. It is also possible to form the on-chip lens 45 also over the optical black area 41.

Figure 4:
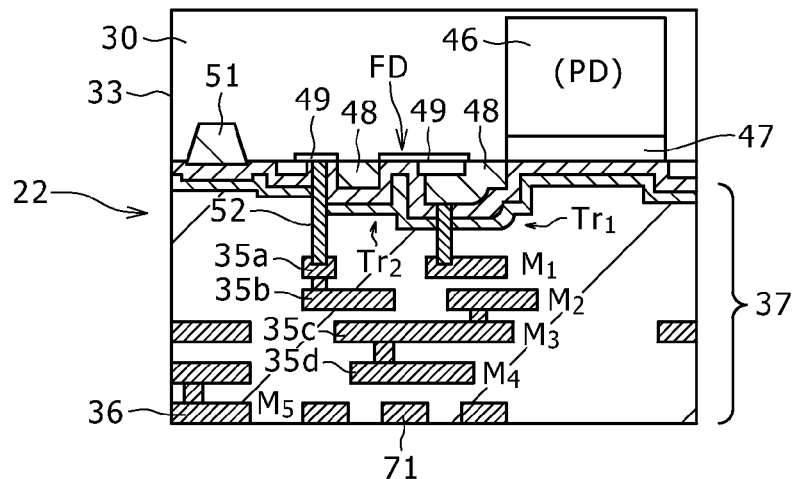
FIG. 4 is an enlarged configuration diagram showing a major part of a first semiconductor chip section in FIG. 3.

In FIG. 3, the pixel transistors Tr1 and Tr2 are shown as representatives of the plural pixel transistors. Although FIG. 3 schematically shows the pixels of the pixel array 160, the details of one pixel are shown in FIG. 4. In the first semiconductor chip 22, the photodiode PD is formed in the semiconductor substrate 33 processed into a thin film form. The photodiode PD has e.g. an n-type semiconductor region 46 and a p-type semiconductor region 47 on the substrate surface side. Over the substrate surface to configure the pixels, gate electrodes 48 are formed each by the intermediary of a gate insulating film and the pixel transistors Tr1 and Tr2 are each formed by the gate electrode 48 and a pair of source and drain regions 49. The pixel transistor Tr1 adjacent to the photodiode PD is equivalent to a floating diffusion FD. Each unit pixel is isolated by an element isolation region 51. The element isolation region 51 is formed into a shallow trench isolation (STI) structure obtained by burying an insulating film such as an $SiO_2$ film in trenches formed in the substrate for example.

In the multilayer wiring layer 37 of the first semiconductor chip section 22, connection is established via electrically-conductive vias 52 between the corresponding pixel transistor and the interconnect 35 and between the interconnects 35 of upper and lower layers adjacent to each other. Furthermore, the connecting interconnect 36 formed of the fifth-layer metal M5 is so formed as to face a bonding surface 40 to the second semiconductor chip section 26. The connecting interconnect 36 is connected to the requisite interconnect 35d formed of the fourth-layer metal M4 via the electrically-conductive vias 52.

In the second semiconductor chip section 26, a logic circuit 55 serving as the peripheral circuit is formed in the area serving as each chip section in a second semiconductor substrate 54 formed of silicon. The logic circuit 55 is formed by plural MOS transistors Tr11 to Tr14 including a CMOS transistor. Over the front surface side of the semiconductor substrate 54, a multilayer wiring layer 59 is formed in which interconnects 57 [57a to 57c] and 58 formed of metals M11 to M14 of plural layers, e.g. four layers in this example, are disposed by the intermediary of an interlayer insulating film 56. Copper (Cu) interconnects by the dual damascene method are used as the interconnects 57 and 58.

Figure 5:
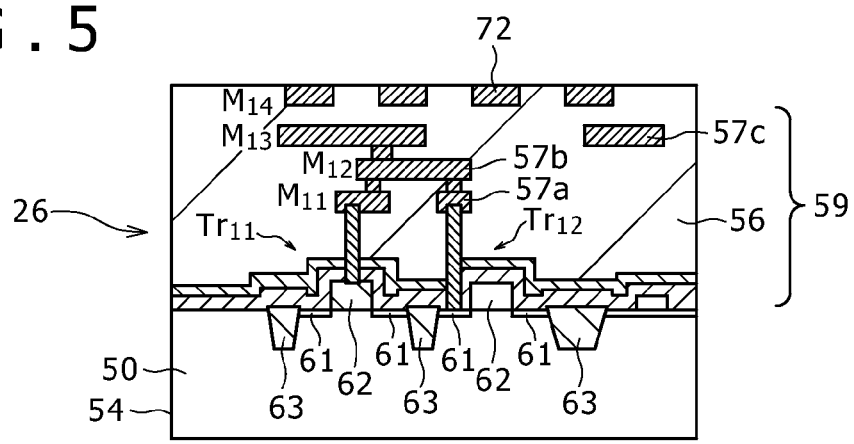
FIG. 5 is an enlarged configuration diagram showing a major part of a second semiconductor chip section in FIG. 3.

In FIG. 3, the MOS transistors Tr11 to Tr14 are shown as representatives of the plural MOS transistors of the logic circuit 55. Although FIG. 3 schematically shows the MOS transistors Tr11 to Tr14, the details of e.g. the MOS transistors Tr11 and Tr12 are shown in FIG. 5. In the second semiconductor chip section 26, each of the MOS transistors Tr11 and Tr12 is so formed as to have a pair of source and drain regions 61 and a gate electrode 62 formed by the intermediary of a gate insulating film in a semiconductor well region on the front surface side of the semiconductor substrate 54. Each of the MOS transistors Tr11 and Tr12 is isolated by an element isolation region 63 having e.g. the STI structure.

In the multilayer wiring layer 59 of the second semiconductor chip section 26, connection is established via electrically-conductive vias 64 between the MOS transistors Tr11 to Tr14 and the interconnect 57 and between the interconnects 57 of upper and lower layers adjacent to each other. Furthermore, the connecting interconnect 58 formed of the fourth-layer metal M14 is so formed as to face the bonding surface 40 to the first semiconductor chip section 22. The connecting interconnect 58 is connected to the requisite interconnect 57c formed of the third-layer metal M13 via the electrically-conductive vias 64.

The first semiconductor chip section 22 and the second semiconductor chip section 26 are electrically connected to each other in such a manner that their respective multilayer wiring layers 37 and 59 are opposed to each other and the connecting interconnects 36 and 58 facing the bonding surface 40 are bonded directly to each other. Interlayer insulating films 66 near the bonding are formed of the combination of a Cu diffusion barrier insulating film for preventing Cu diffusion of the Cu interconnects and an insulating film that does not have the Cu diffusion barrier character as shown in a manufacturing method to be described later. The direct bonding between the connecting interconnects 36 and 58 formed of Cu interconnects is carried out by thermal diffusion bonding. The bonding between the insulating films 66 at the bonding surfaces on which neither the connecting interconnect 36 nor 58 exists is carried out by plasma bonding or an adhesive.

Figure 6:
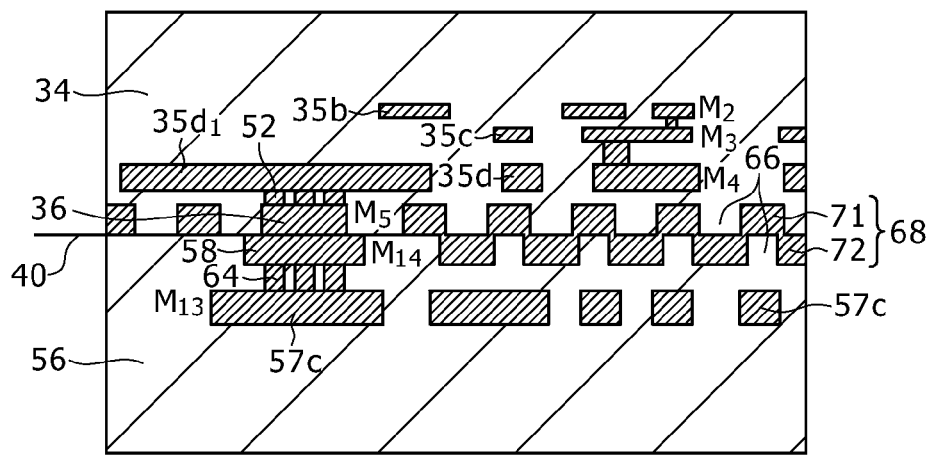
FIG. 6 is an enlarged configuration diagram showing a major part of a bonding part in FIG. 3.
Figure 7A:
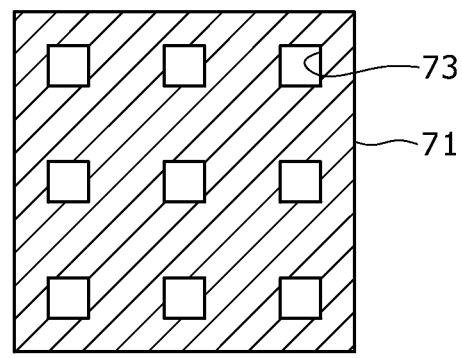
FIGS. 7A to 7C are configuration diagrams showing a light blocking layer in the first embodiment.
Figure 7B:
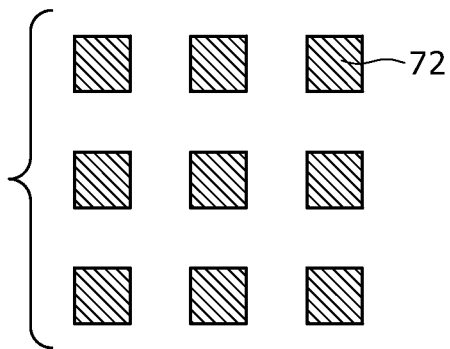
Figure 7C:
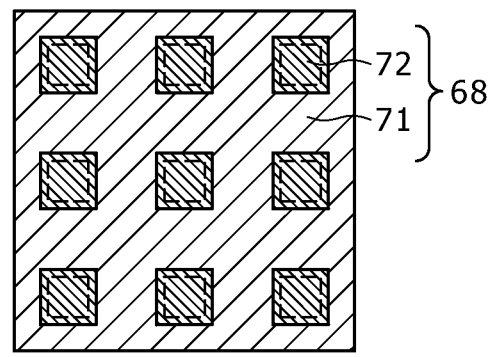

In the present embodiment, particularly as shown in FIG. 3 and FIG. 6 (enlarged diagram of the major part), a light blocking layer 68 formed of electrically-conductive films of the same layers as those of the connecting interconnects is formed near the bonding between the first and second semiconductor chip sections 22 and 26. The light blocking layer 68 of the present embodiment is formed by a light blocking component 71 formed of the metal M5 of the same layer as that of the connecting interconnect 36 of the first semiconductor chip section 22 and a light blocking component 72 formed of the metal M14 of the same layer as that of the connecting interconnect 58 of the second semiconductor chip section 26. In this case, as shown in FIGS. 7A to 7C, either one of the light blocking components 71 or 72, i.e. the light blocking component 71 in the present example, is formed into a shape having plural apertures 73 at predetermined pitches in the vertical and horizontal directions in top view (see FIG. 7A). Furthermore, the other light blocking component 72 is formed into a shape of dots covering the apertures 73 of the light blocking component 71 in top view (see FIG. 7B). The light blocking layer 68 is so configured that both light blocking components 71 and 72 overlap with each other in such a state as to uniformly cover the surface in top view (see FIG. 7C).

The light blocking component 71 and the light blocking component 72 covering the apertures 73 of the light blocking component 71 are so formed as to partially overlap with each other. When the connecting interconnects 36 and 58 are bonded directly to each other, the light blocking component 71 and the light blocking component 72 are bonded directly to each other at the simultaneously-overlapped part. Various shapes are possible as the shape of the apertures 73 of the light blocking component 71. In the diagram, each of the apertures 73 is formed into a rectangular shape. The light blocking component 72 in a dot manner has a shape covering the apertures 73. In the diagram, each dot of the light blocking component 72 is formed into a rectangular shape having an area somewhat larger than that of the corresponding one of the apertures 73. It is preferable that a fixed potential, e.g. the ground potential, be applied to the light blocking layer 68 so that the light blocking layer 68 may be stable in terms of the potential.

[Manufacturing Method Example of Solid-State Imaging Device]

Figure 8:
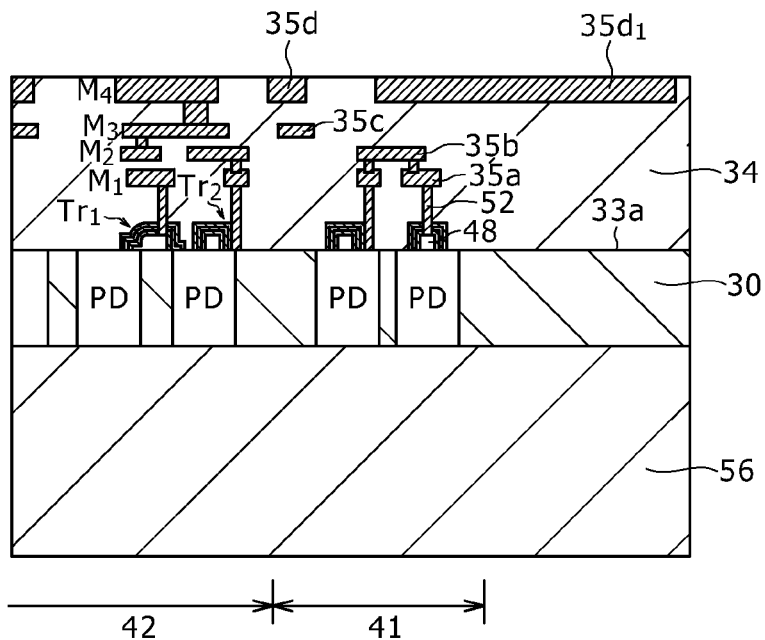
FIG. 8 is a manufacturing process diagram (first diagram) showing a manufacturing method example of the solid-state imaging device according to the first embodiment.
Figure 9:
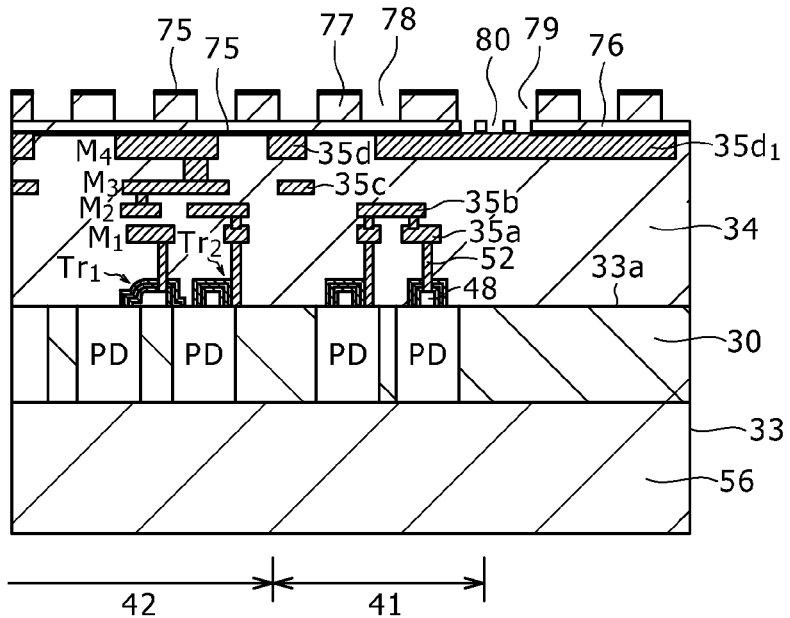
FIG. 9 is a manufacturing process diagram (second diagram) showing the manufacturing method example of the solid-state imaging device according to the first embodiment.
Figure 10:
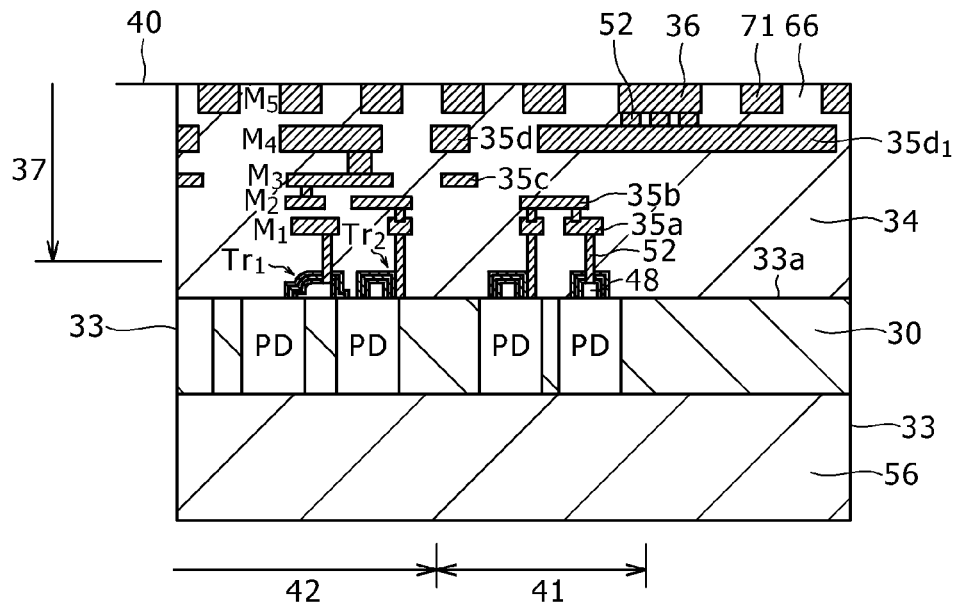
FIG. 10 is a manufacturing process diagram (third diagram) showing the manufacturing method example of the solid-state imaging device according to the first embodiment.
Figure 11:
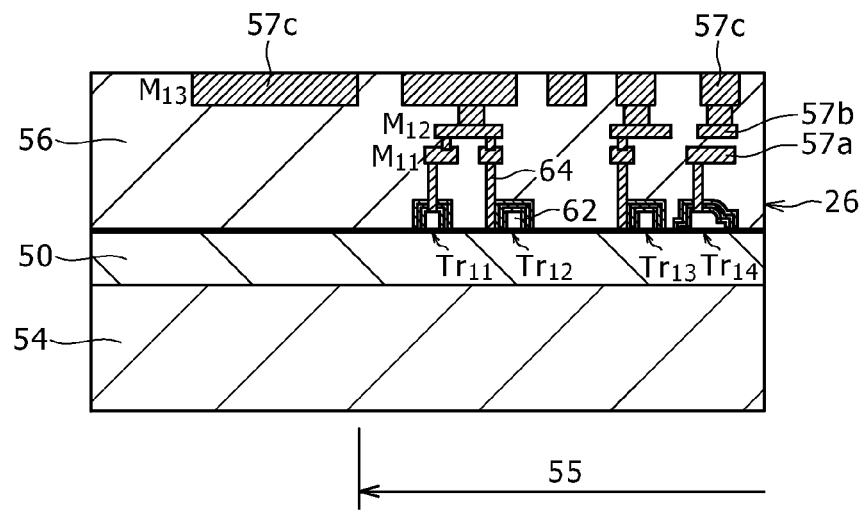
FIG. 11 is a manufacturing process diagram (fourth diagram) showing the manufacturing method example of the solid-state imaging device according to the first embodiment.
Figure 12:
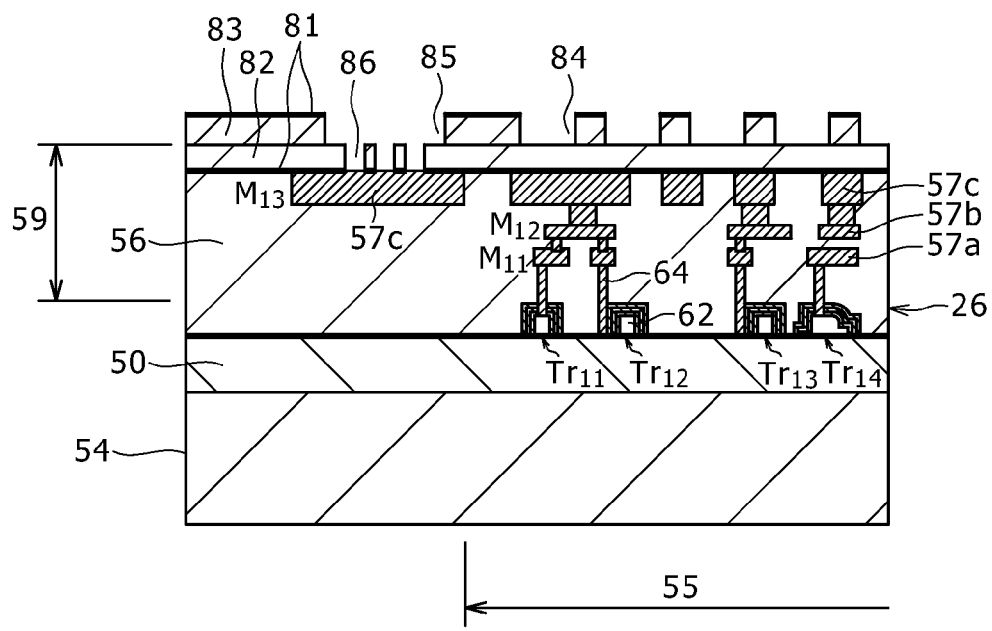
FIG. 12 is a manufacturing process diagram (fifth diagram) showing the manufacturing method example of the solid-state imaging device according to the first embodiment.
Figure 13:
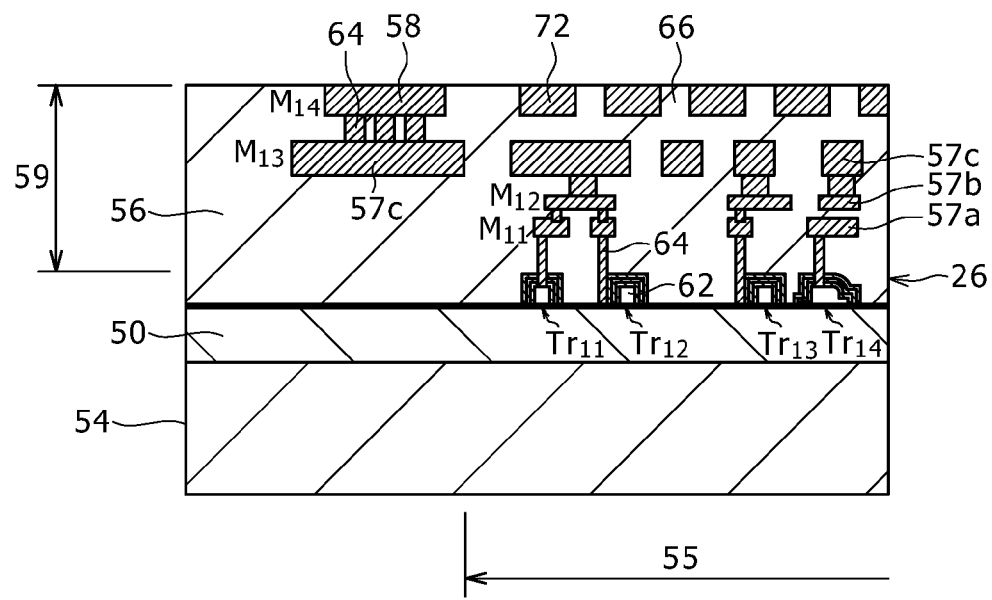
FIG. 13 is a manufacturing process diagram (sixth diagram) showing the manufacturing method example of the solid-state imaging device according to the first embodiment.
Figure 14:
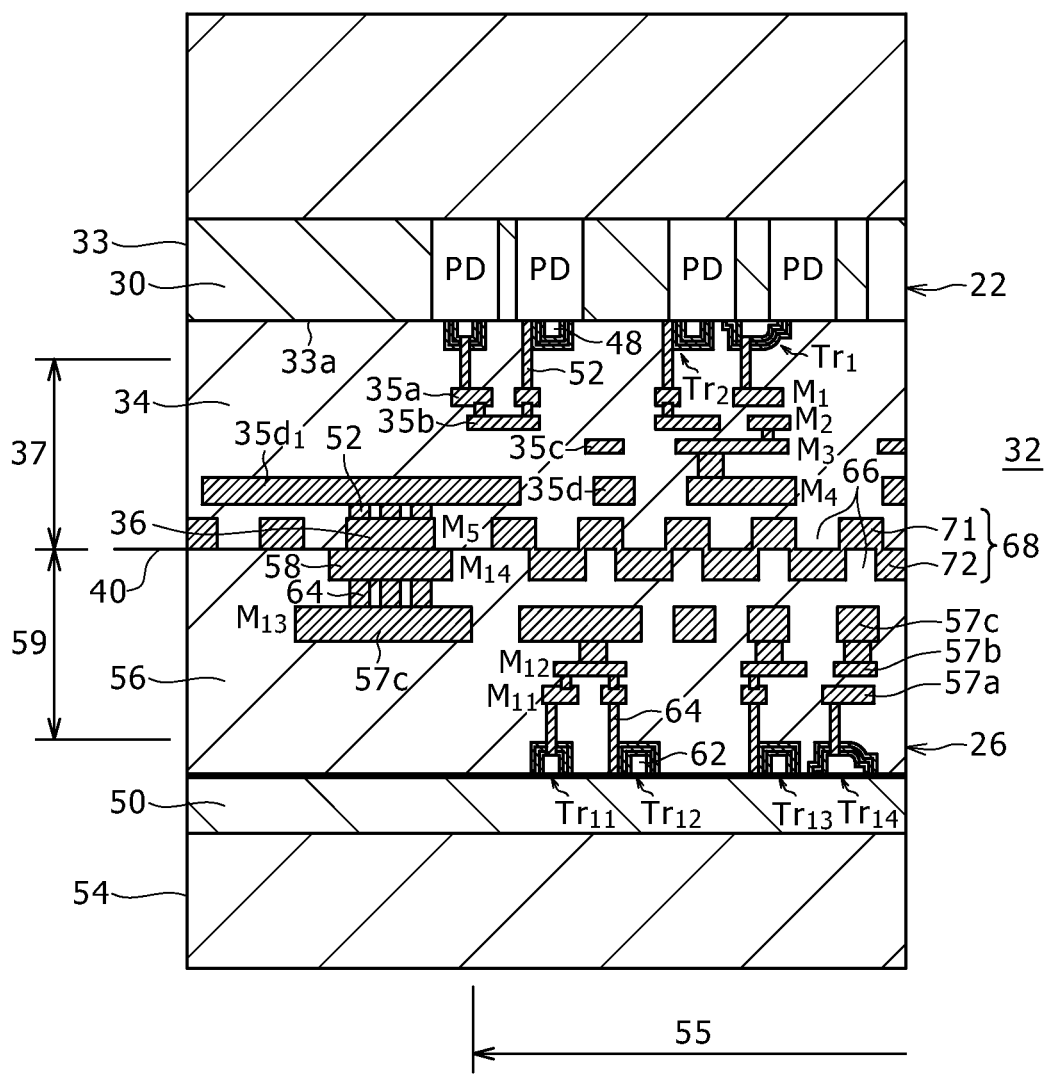
FIG. 14 is a manufacturing process diagram (seventh diagram) showing the manufacturing method example of the solid-state imaging device according to the first embodiment.
Figure 15:
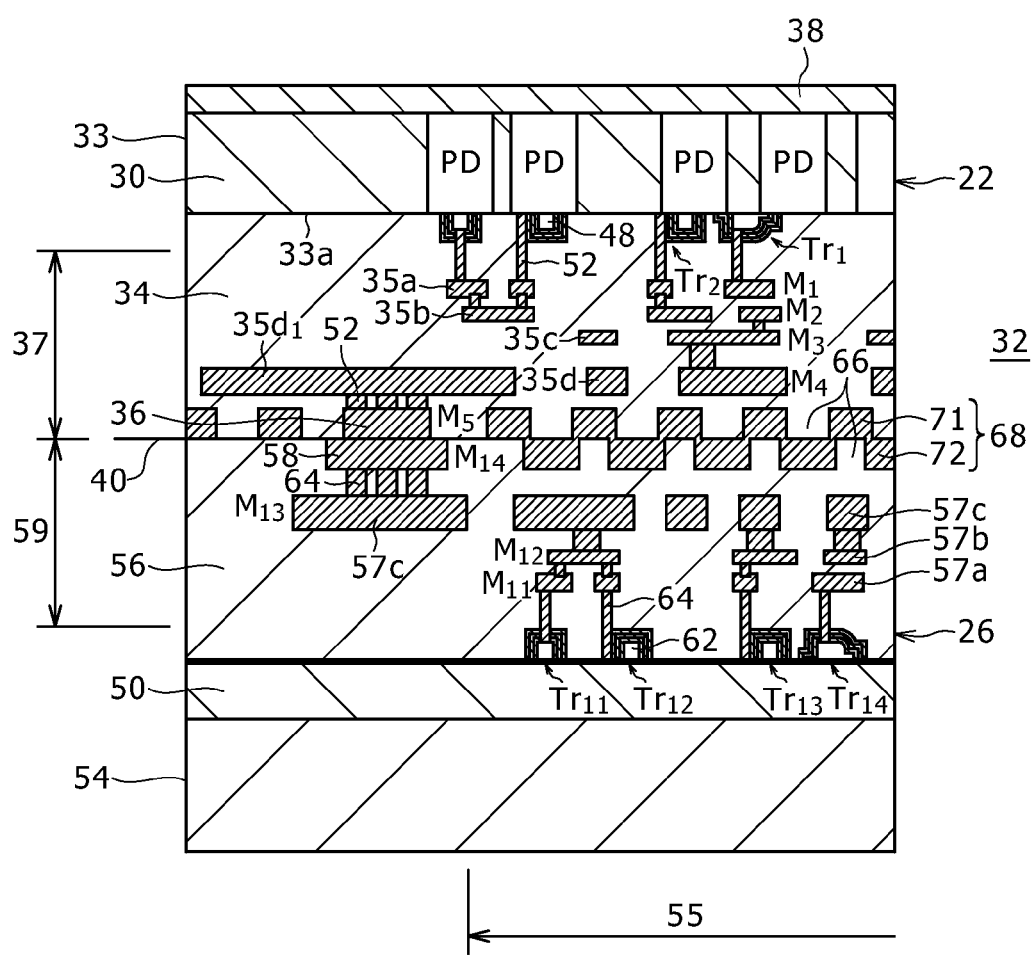
FIG. 15 is a manufacturing process diagram (eighth diagram) showing the manufacturing method example of the solid-state imaging device according to the first embodiment.
Figure 16:
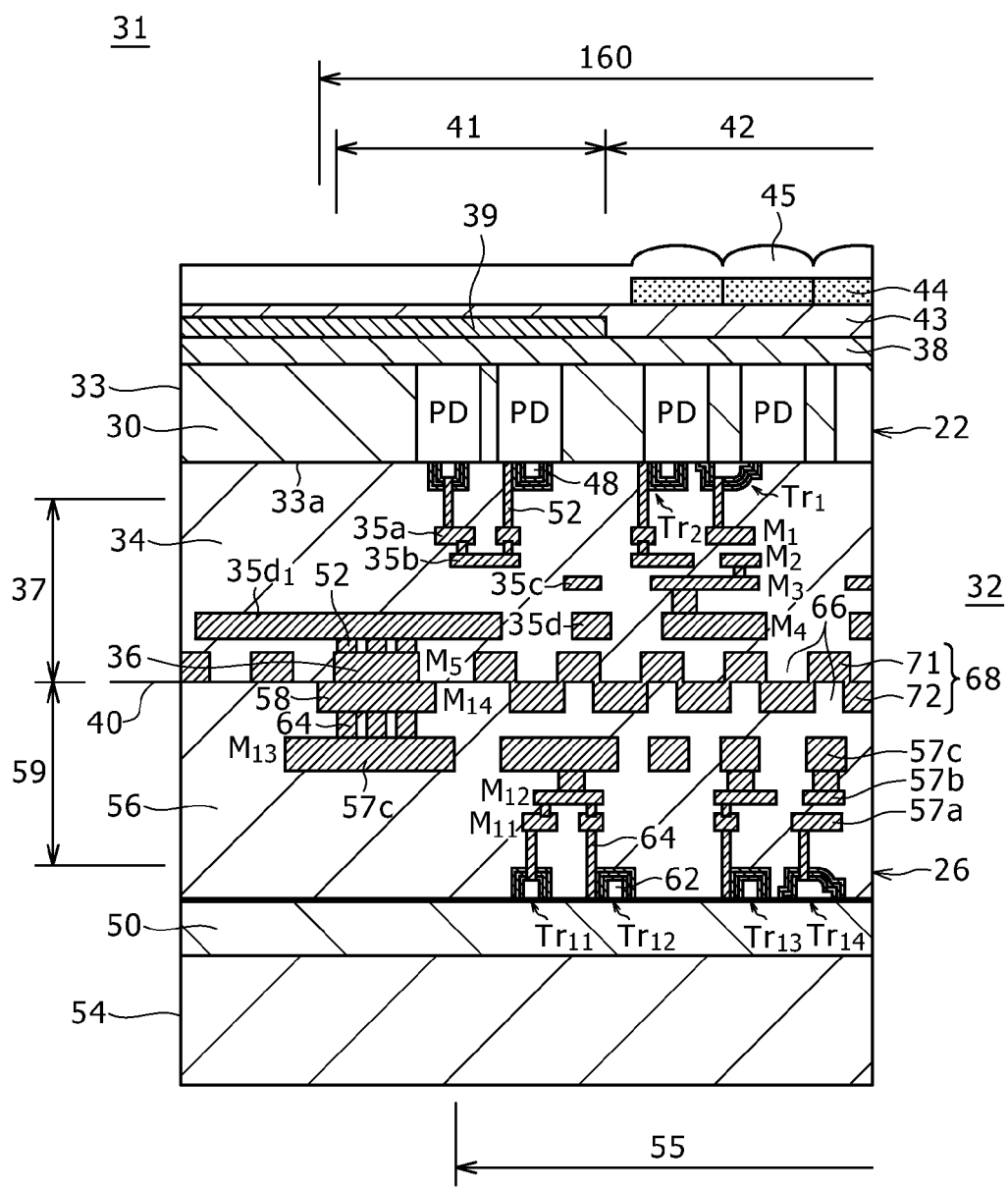
FIG. 16 is a manufacturing process diagram (ninth diagram) showing the manufacturing method example of the solid-state imaging device according to the first embodiment.

FIGS. 8 to 16 show a manufacturing method example of the solid-state imaging device 31 according to the first embodiment. FIGS. 8 to 10 show steps for the first semiconductor chip section having the pixel array. FIGS. 11 to 13 show steps for the second semiconductor chip section having the logic circuit. FIGS. 14 to 16 show steps of bonding and the subsequent processing.

First, as shown in FIG. 8, a semiconductor well region 30 is formed in the area to serve as each chip section in the first semiconductor wafer (hereinafter, referred to as the semiconductor substrate) 33 formed of e.g. silicon, and the photodiodes PD serving as the photoelectric converters of the respective pixels are formed in this semiconductor well region 30. The element isolation region 51 (see FIG. 4) can be formed at first although not shown in the diagram. Each photodiode PD is so formed as to be extended in the depth direction of the semiconductor well region 30. The photodiodes PD are formed in the effective pixel area 42 and the optical black area 41, both of which configure the pixel array 160.

Furthermore, plural pixel transistors configuring the respective pixels are formed on the front surface side of the semiconductor well region 30. The pixel transistors can be configured by e.g. a transfer transistor, a reset transistor, an amplification transistor, and a selection transistor. Here, the pixel transistors Tr1 and Tr2 are shown as representatives as described above. Each of the pixel transistors Tr1 and Tr2 has the pair of source and drain regions and the gate electrode formed by the intermediary of the gate insulating film although not shown in the diagram.

Over the front surface side of the semiconductor substrate 33, the interconnects 35 [35a, 35b, 35c and 35d] formed of the metals M1 to M4 of plural layers, i.e. four layers in the present example, are formed, including the electrically-conductive vias 52, by the intermediary of the interlayer insulating film 34. The interconnects 35 can be formed by a dual damascene method. Specifically, a connecting hole and an interconnect trench by a via-first process are simultaneously formed in the interlayer insulating film 34, and a Cu diffusion barrier metal film for preventing Cu diffusion and a Cu seed film are formed. Thereafter, a Cu material layer is buried by a plating method. Examples of the Cu diffusion barrier metal film include Ta, TaN, Ti, TiN, W, WN, Ru, TiZrN films, and alloy films containing these materials. Subsequently, the excess Cu material layer is removed by a chemical mechanical polishing (CMP) method, so that a Cu interconnect monolithic with the planarized electrically-conductive via is formed. Thereafter, the Cu diffusion barrier insulating film is deposited although not shown in the diagram. As the Cu diffusion barrier insulating film, e.g. an insulating film of SiN, SiC, SiCN, or SiON or benzocyclobutene (BCB: adhesive) as a resin can be used. By repeating this step, the interconnects 35a to 35d formed of the metals M1 to M4 of four layers are formed.

Next, as shown in FIG. 9, a first insulating film 76 that does not have the Cu diffusion barrier character, a second insulating film 77 that does not have the Cu diffusion barrier character, and a Cu diffusion barrier insulating film 75 are sequentially formed. The first insulating film 76 and the second insulating film 77 are formed of an $SiO_2$ film, an SiCOH film, etc. As the Cu diffusion barrier insulating film 75, e.g. an insulating film of SiN, SiC, SiCN, or SiON or benzocyclobutene (BCB: adhesive) as a resin can be used as with the above description. The Cu diffusion barrier insulating film 75, the first insulating film 76, and the second insulating film 77 are equivalent to the interlayer insulating film 34. Subsequently, the outermost Cu diffusion barrier insulating film 75, the second insulating film 77, and the first insulating film 76 are patterned to selectively open via holes 80 by a via-first process by using lithography and etching technique. Thereafter, the second insulating film 77 is patterned to selectively form apertures 78 and 79. That is, the films are so patterned as to have the apertures 78 at the parts corresponding to the light blocking component 71 (part except the apertures 73) that should be formed, the aperture 79 at the part corresponding to the connecting interconnect 36 that should be formed, and the via holes 80.

Next, as shown in FIG. 10, the light blocking component 71 having the apertures 73, the electrically-conductive vias 52 connected to the interconnect 35d, and the connecting interconnect 36 are formed by burying a Cu material in the apertures 78 and 79 and the via holes 80 by use of the dual damascene method as with the above description. The light blocking component 71 and the connecting interconnect 36 are formed by the fifth-layer metal M5. Thereby, the multilayer wiring layer 37 is formed by the interconnects 35a to 35d, the connecting interconnect 36, the light blocking component 71, which are formed of the metals Ml to M5, the interlayer insulating films 34, the Cu diffusion barrier insulating film 75, the first insulating film 76, and the second insulating film 77. It is preferable that an interconnect 35d1 formed of the fourth-layer metal M4 connected to the connecting interconnect 36 be so formed as to be sufficiently extended to the side of the light blocking component 71 and have such an area as to overlap with the light blocking component 71 so that emitted light from the logic circuit side may be prevented from leaking to the side of the photodiode PD.

The reason why the light blocking component 71 is formed into a pattern having the apertures 73 is as follows. If the area of the Cu pattern in the light blocking component 71 is set large, a recess is generated due to dishing in the chemical mechanical polishing (CMP). Thus, a gap is generated in the bonding between the substrates and sufficient adhesion is not obtained. Alternatively, if pressure for tight adhesion is set high so that the gap generation may be prevented, misalignment between the substrates due to strain becomes large and alignment between the patterns becomes difficult. Therefore, the apertures 73 are provided to limit the area of the light blocking component 71 so that the recess generation may be prevented.

The light blocking component 71 is in direct contact with the surface on which no Cu film exits in the bonding surface on the second semiconductor chip section side. Thus, the Cu diffusion barrier insulating film 75 is suitable as the interlayer insulating film facing the bonding surface in the first semiconductor chip section.

Meanwhile, as shown in FIG. 11, a semiconductor well region 50 is formed in the area to serve as each chip section in the second semiconductor wafer (hereinafter, referred to as the semiconductor substrate) 54 formed of e.g. silicon. The plural MOS transistors Tr11 to Tr14 configuring the logic circuit 55 are formed in this semiconductor well region 50. Here, the MOS transistors Tr11 to Tr14 are represented as representatives as described above. The element isolation region 63 (see FIG. 5) can be formed at first although not shown in the diagram.

Over the front surface side of the semiconductor substrate 54, the interconnects 57 [57a, 57b and 57c] formed of the metals M11 to M13 of plural layers, i.e. three layers in the present example, are formed, including the electrically-conductive vias 64, by the intermediary of the interlayer insulating film 56. The interconnects 57 can be formed by the dual damascene method. Specifically, a connecting hole and an interconnect trench by a via-first process are simultaneously formed in the interlayer insulating film 56, and a Cu diffusion barrier metal film for preventing Cu diffusion and a Cu seed film are formed. Thereafter, a Cu material layer is buried by a plating method. Examples of the Cu diffusion barrier metal film include Ta, TaN, Ti, TiN, W, WN, Ru, TiZrN films, and alloy films containing these materials. Subsequently, the excess Cu material layer is removed by a chemical mechanical polishing (CMP) method, so that a Cu interconnect monolithic with the planarized electrically-conductive via is formed. Thereafter, the Cu diffusion barrier insulating film is deposited although not shown in the diagram. As the Cu diffusion barrier insulating film, e.g. an insulating film of SiN, SiC, SiCN, or SiON or benzocyclobutene (BCB: adhesive) as a resin can be used. By repeating this step, the interconnects 57a to 57c formed of the metals M11 to M13 of three layers are formed.

Next, as shown in FIG. 12, a first insulating film 82 that does not have the Cu diffusion barrier character, a second insulating film 83 that does not have the Cu diffusion barrier character, and a Cu diffusion barrier insulating film 81 are sequentially formed. The first insulating film 82 and the second insulating film 83 are formed of an SiO₂ film, an SiCOH film, etc. As the Cu diffusion barrier insulating film 81, e.g. an insulating film of SiN, SiC, SiCN, or SiON or benzocyclobutene (BCB: adhesive) as a resin can be used as with the above description. The Cu diffusion barrier insulating film 81, the first insulating film 82, and the second insulating film 83 are equivalent to the interlayer insulating film 56. Subsequently, the outermost Cu diffusion barrier insulating film 81, the second insulating film 83, and the first insulating film 82 are patterned to selectively open via holes 86 by a via-first process by using lithography and etching technique. Thereafter, the second insulating film 83 is patterned to selectively form apertures 84 and 85. The apertures 84 are formed at such positions as to cover the apertures 73 of the light blocking component 71 of the first semiconductor chip side. It is preferable that this aperture 84 be formed to have such a size as to cover the aperture 73 of the light blocking component 71 and partially overlap with the light blocking component 71 so that light leakage due to bonding misalignment may be prevented when the first semiconductor substrate is bonded to the second semiconductor substrate later.

That is, the films are so patterned as to have the apertures 84 at the parts corresponding to the light blocking component 72 that should be formed, the aperture 85 at the part corresponding to the connecting interconnect 58 that should be formed, and the via holes 86.

Next, as shown in FIG. 13, the light blocking component 72 having a dot shape, the electrically-conductive vias 64 connected to the interconnect 57c, and the connecting interconnect 58 are formed by burying a Cu material in the apertures 84 and 85 and the via holes 86 by use of the dual damascene method as with the above description. The light blocking component 72 and the connecting interconnect 58 are formed by the fourth-layer metal M14. Thereby, the multilayer wiring layer 59 is formed by the interconnects 57a to 57c, the connecting interconnect 58, the light blocking component 72, which are formed of the metals M11 to M14, the interlayer insulating films 56, the Cu diffusion barrier insulating film 81, the first insulating film 82, and the second insulating film 83.

Next, as shown in FIG. 14, the first semiconductor substrate 33 is bonded to the second semiconductor substrate 54 in such a manner that their respective multilayer wiring layers are opposed to each other and both connecting interconnects 36 and 58 are brought into direct contact with and electrically connected to each other. That is, the first and second semiconductor substrates 33 and 54 are physically bonded and electrically connected to each other. At this time, the light blocking component 71 and the light blocking component 72 are also bonded directly to each other at the overlapping part. Specifically, thermal diffusion bonding between the connecting interconnects 36 and 58 and between the light blocking components 71 and 72 is performed by heat treatment. The heat treatment temperature at this time can be set to about 100° C. to 500° C. Furthermore, the insulating films as the interlayer insulating films are subjected to surface treatment and bonded to each other by plasma bonding or an adhesive. The Cu surface of the connecting interconnects 36 and 58 and the light blocking components 71 and 72 is easily oxidized. It is also possible to perform reduction treatment for removing the oxide film on the Cu surface before the bonding. The reduction treatment can be performed by e.g. a hydrogen gas, a mixed gas of hydrogen and argon, hydrogen plasma, ammonia plasma, argon plasma, or the like.

Next, as shown in FIG. 15, the first semiconductor substrate 33 is ground and polished from the back surface side to be processed into a thin film form by using the CMP method or the like, with the desired film thickness of the photodiode PD left.

Next, as shown in FIG. 16, the light blocking film 39 covering the area over the photodiodes PD corresponding to the optical black area 41 is formed over the surface of the substrate processed into a thin film form by the intermediary of the insulating film 38. Furthermore, the color filter 44 and the on-chip lens 45 are formed over the photodiodes PD corresponding to the effective pixel area 42 by the intermediary of the planarizing film 43.

Subsequently, chipping of separating the bonded first and second semiconductor substrates 33 and 54 into the respective chips is performed, so that the intended solid-state imaging device 31 shown in FIG. 3 is obtained.

As the metals M5 and M14 serving as the light blocking components 71 and 72, the connecting interconnects 36 and 58, and interconnects of the same layers as those of them, a material that has high electrical conductivity and high light blocking capability and is easy to bond is preferable. As a material having such characters, besides Cu, a single material such as Al, W, Ti, Ta, Mo, or Ru or an alloy can be used.

It is preferable to determine the film thickness of the light blocking layer 68, i.e. the film thickness of the light blocking components 71 and 72 in the present example, depending on the wavelength of light on the side of the second semiconductor chip section 26 involving light emission. In the present embodiment, light emitted from hot carriers of the MOS transistor of the second semiconductor chip section 26 should be blocked. Therefore, the light blocking layer thickness should be designed in consideration of light having a wavelength of about 1 μm. For example, the film thickness of the light blocking layer 68 and hence the film thickness of the light blocking components 71 and 72 can be set to about 50 nm to 800 nm.

Figure 17:
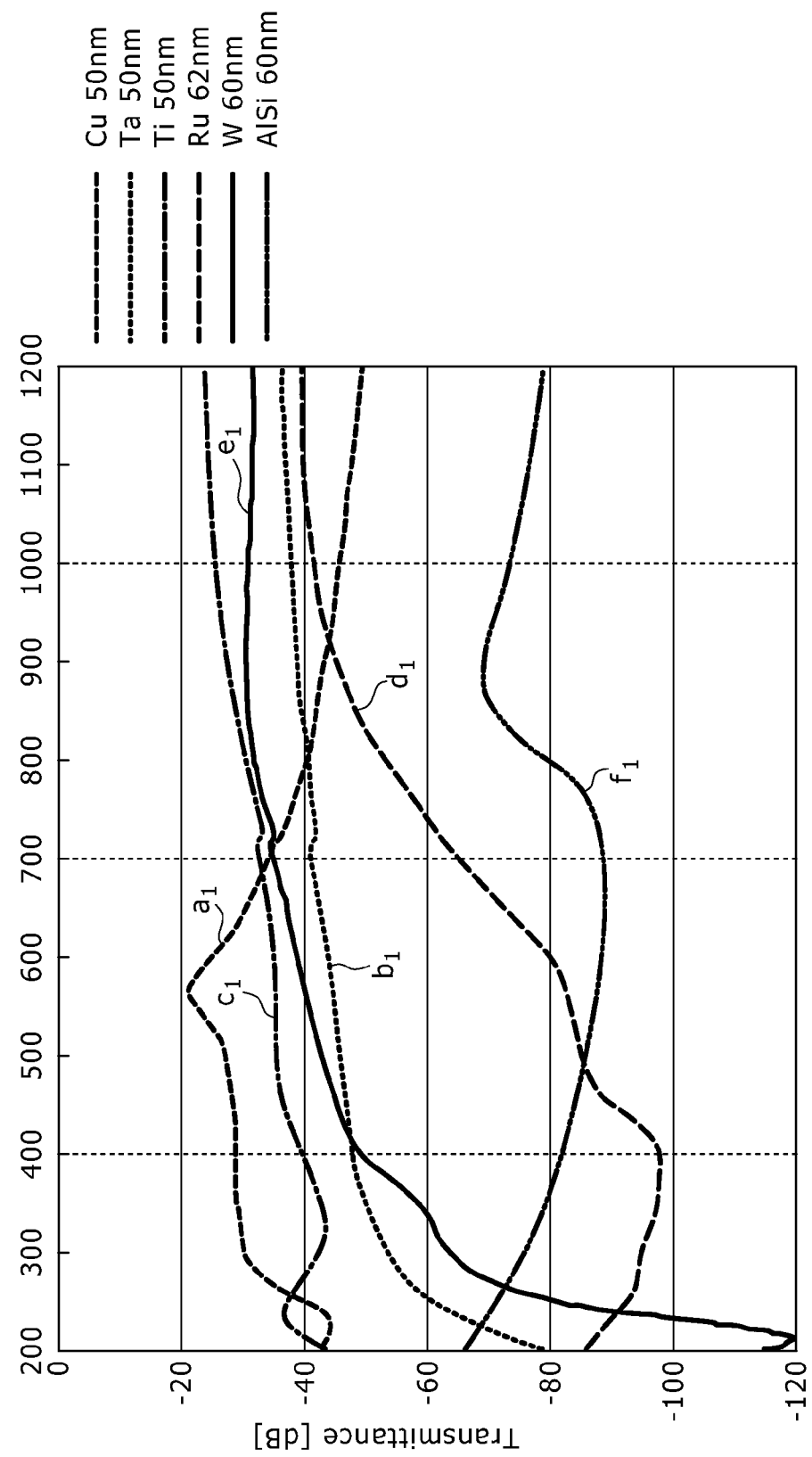
FIG. 17 is a graph that is used for explaining an embodiment of the present disclosure and shows the dependence of the light transmittance on the wavelength regarding a specific film thickness.

FIG. 17 shows the dependence of the transmittance on the light wavelength regarding Cu, Ta, Ti, Ru, W, and AlSi at specific film thicknesses. A curve a1 corresponds to a Cu film having a film thickness of 50 nm. A curve b1 corresponds to a Ta film having a film thickness of 50 nm. A curve c1 corresponds to a Ti film having a film thickness of 50 nm. A curve d1 corresponds to a Ru film having a film thickness of 62 nm. A curve e1 corresponds to a W film having a film thickness of 60 nm. A curve f1 corresponds to an AlSi film having a film thickness of 60 nm. Based on the graph of FIG. 17, a metal film that is suitable to block light having a wavelength of 300 nm to 1 μm can be selected.

Figure 18:
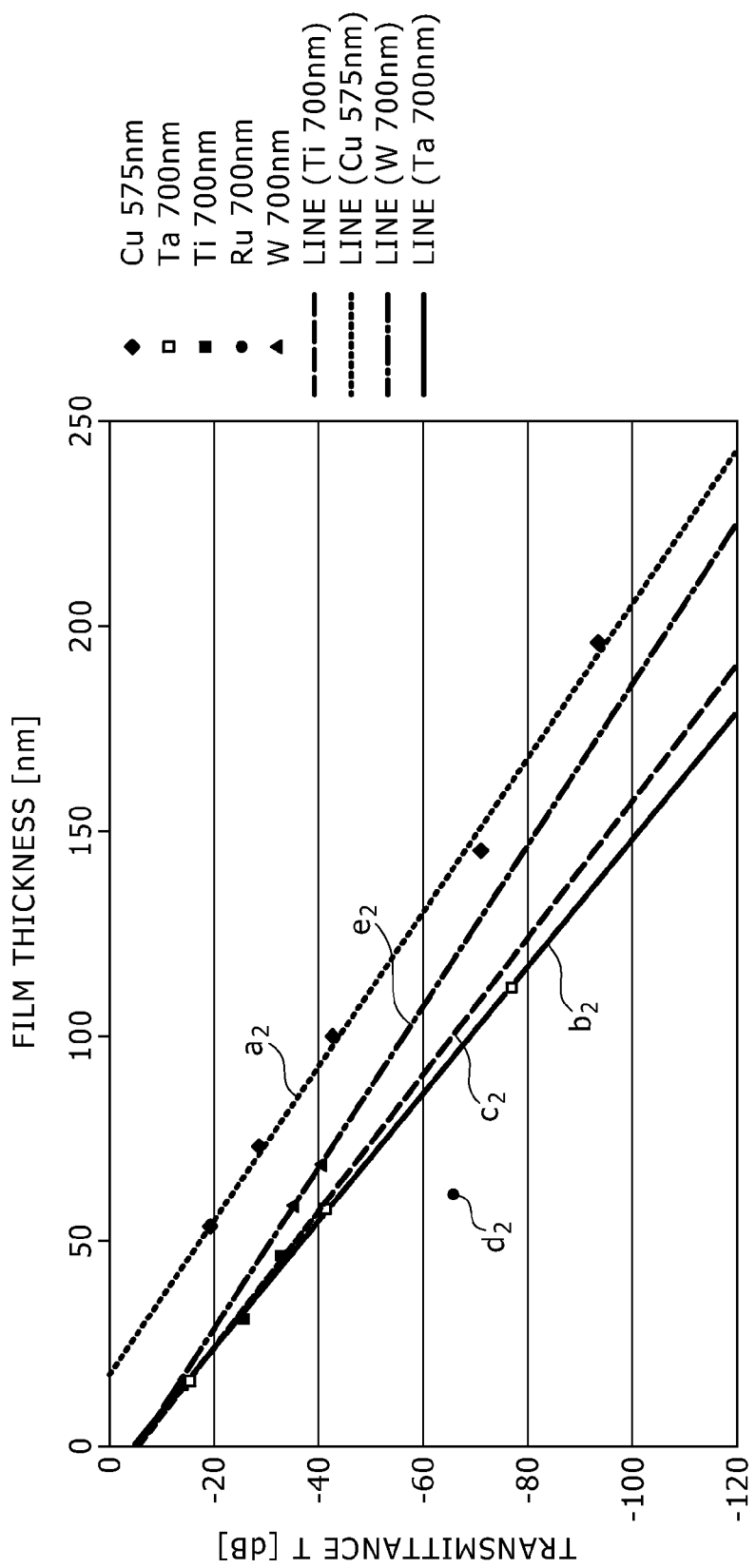
FIG. 18 is a graph that is used for explaining an embodiment of the present disclosure and shows the dependence of the light transmittance on the film thickness of a metal film regarding a specific wavelength.

FIG. 18 shows the dependence of the transmittance on the film thickness regarding Cu, Ta, Ti, Ru, and W at specific wavelengths of light. A straight line a2 shows the character of a Cu film at a wavelength of 575 nm. A straight line b2 shows the character of a Ta film at a wavelength of 700 nm. A straight line c2 shows the character of a Ti film at a wavelength of 700 nm. A point d2 shows the character of a Ru film at a wavelength of 700 nm. A straight line e2 shows the character of a W film at a wavelength of 700 nm. Based on the graph of FIG. 18, the film thicknesses of the respective metal films to obtain the desired light blocking rate can be selected. Also in the case of blocking emitted light near a wavelength of 1 μm due to hot carriers from a transistor, the film thickness can be selected by a similar method.

In the solid-state imaging device 31 and the manufacturing method thereof according to the first embodiment, the light blocking layer 68 formed of the metals M5 and M14 of the same layers as those of the connecting interconnects 36 and 58 is formed near the bonding between the first semiconductor chip section 22 and the second semiconductor chip section 26. This light blocking layer 68 can suppress the incidence of emitted light due to hot carriers from the MOS transistor of the logic circuit 55 of the second semiconductor chip section 26 on the pixel array of the first semiconductor chip section 22. Therefore, the adverse effects of the light emission due to the hot carriers are suppressed and thus dark current and random noise can be suppressed.

Figure 22:
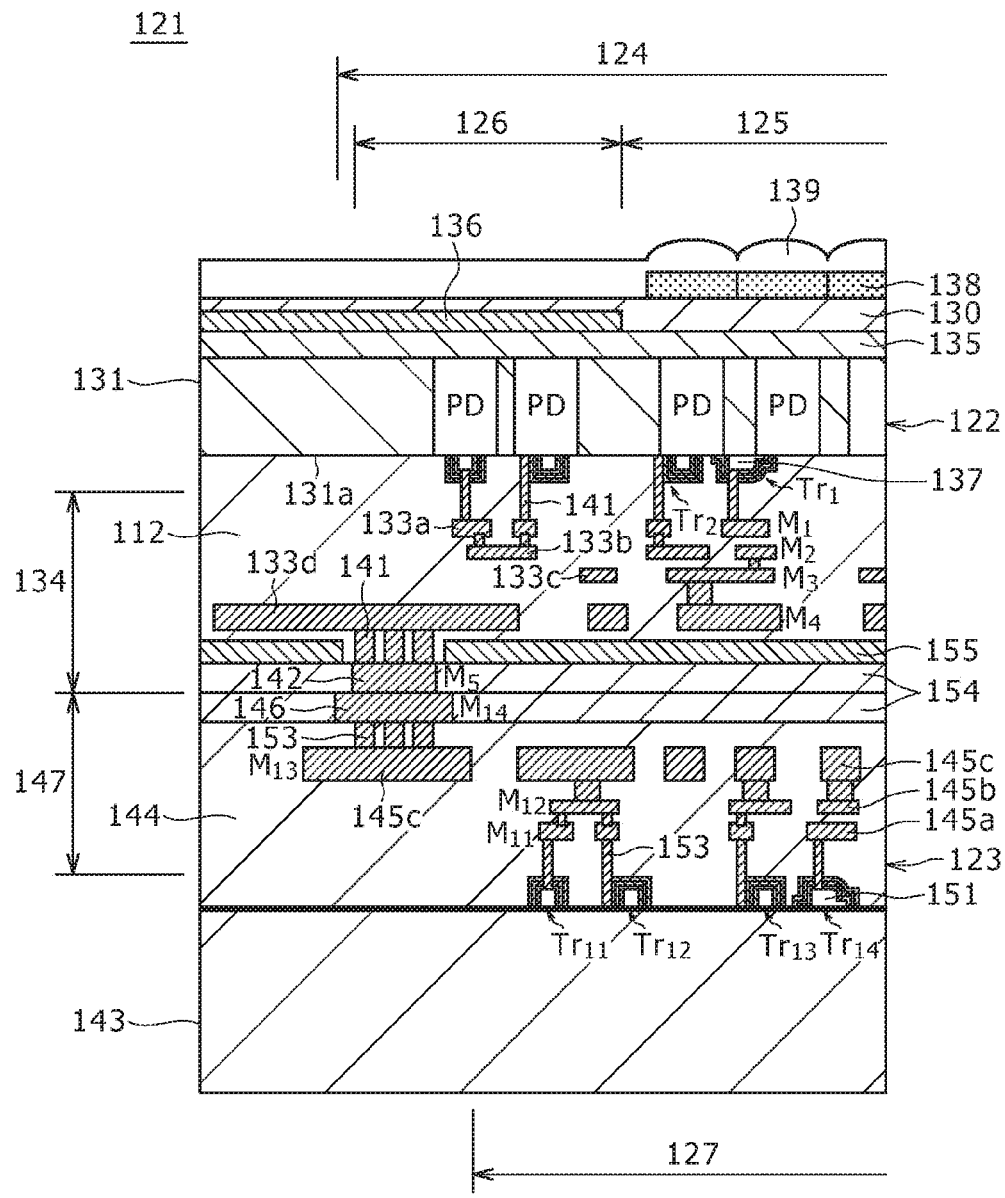
FIG. 22 is a schematic configuration diagram of a major part of a solid-state imaging device according to a related-art example.
Figure 23:
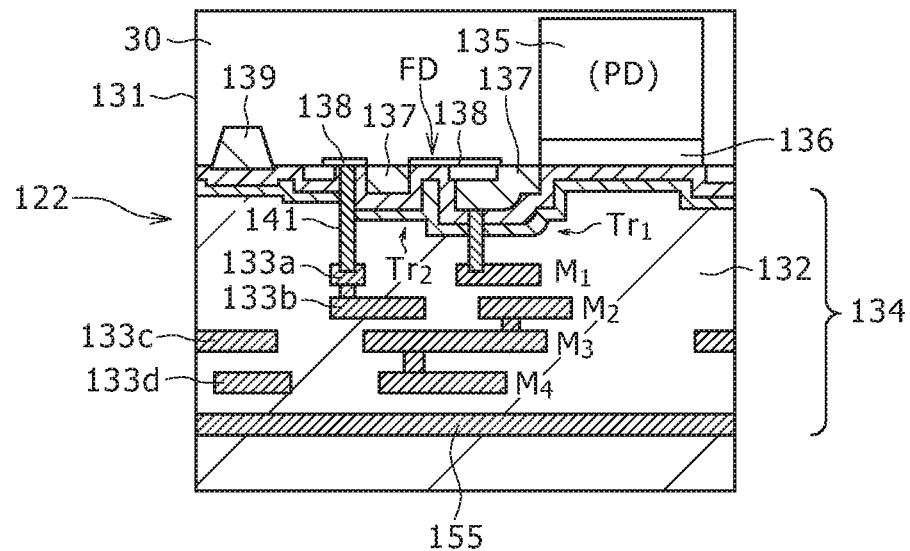
FIG. 23 is an enlarged configuration diagram showing a major part of a first semiconductor chip section in FIG. 22.
Figure 24:
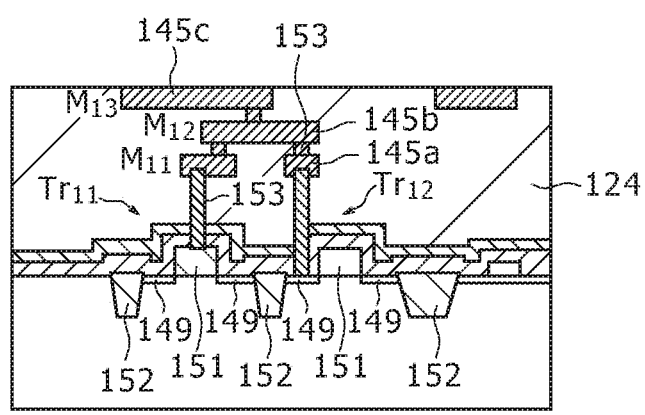
FIG. 24 is an enlarged configuration diagram showing a major part of a second semiconductor chip section in FIG. 22.

Because the light blocking layer 68 is formed by the metals M5 and M14 of the same layers as those of the connecting interconnects 36 and 58, the thickness of the whole bonded semiconductor chip can be set smaller than that of the related-art example of FIG. 22 and the thickness of the solid-state imaging device 31 can be further reduced. This can provide a solid-state imaging device having less dark current and random noise without increasing the thickness of the whole semiconductor chip.

In the first semiconductor chip section 22, the interconnect 35d1 formed of the metal M4 connected to the connecting interconnect 36 via the electrically-conductive vias 52 is so formed as to be extended to the side of the light blocking component 71 and overlap with the light blocking component 71. This can prevent emitted light from the second semiconductor chip section 26 from leaking to the pixel array through a gap.

In the manufacturing method, the interconnects, the connecting interconnects, and the light blocking layer can be simultaneously formed. Thus, reduction in the number of manufacturing steps, reduction in the mask step, and reduction in the material cost are achieved and a solid-state imaging device having less dark current and random noise can be manufactured at low cost. In the forming of the via holes 80 in the step of FIG. 9, the via holes 80 can be easily formed because the aspect ratio of the via hole is lower than that in the related-art example of FIG. 22.

In the bonding between the first semiconductor substrate 33 and the second semiconductor substrate 54, so-called intermetallic bonding such as bonding between the connecting interconnects and bonding between the light blocking components is obtained with a high area ratio. Therefore, high bonding strength is obtained and abnormalities due to film separation are suppressed. Thus, a solid-state imaging device can be manufactured at a high yield.

Metal layers having a large area, i.e. the connecting interconnects 36 and 58 and the light blocking layer 68, exist between the first and second semiconductor chip sections 22 and 26. Thus, heat radiation from the logic circuit 55 can be dispersed and the rise of the temperature on the pixel array side can be suppressed. Therefore, it is possible to provide a solid-state imaging device free from characteristic deterioration such as dark current of the pixel array when the operating temperature rises.

The light blocking layer 68 is formed of the light blocking component 71 having the apertures 73 for one side and the light blocking component 72 having a shape of dots covering the apertures 73 for the other. Due to this feature, the areas of both light blocking components 71 and 72 can be set small. Thus, a recess due to chemical mechanical polishing (CMP) in the forming of the light blocking components is not generated, which provides favorable bonding between both semiconductor chip sections 22 and 26.

[Modification Example of Light Blocking Layer]

Figure 19A:
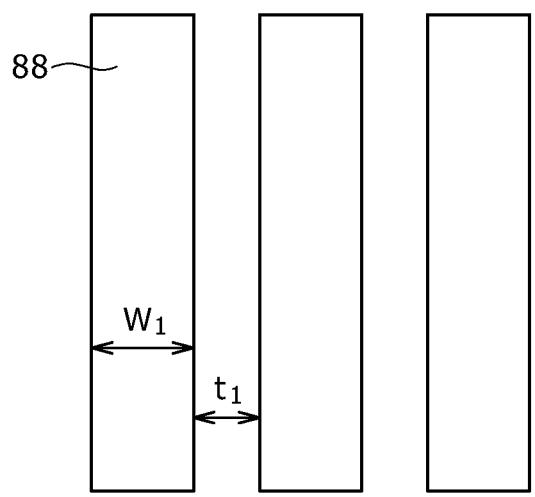
FIGS. 19A to 19C are configuration diagrams showing a modification example of the light blocking layer according to the embodiment.
Figure 19B:
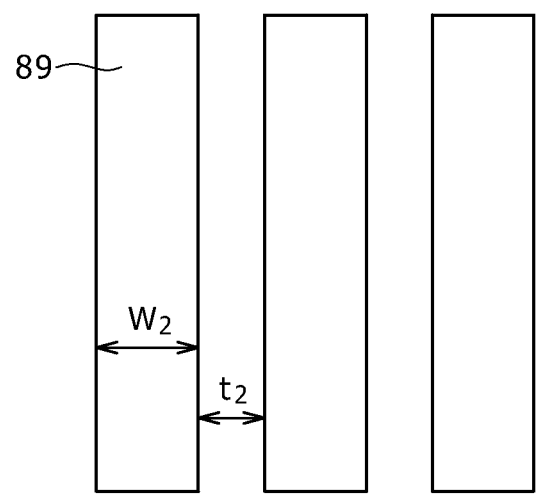
Figure 19C:
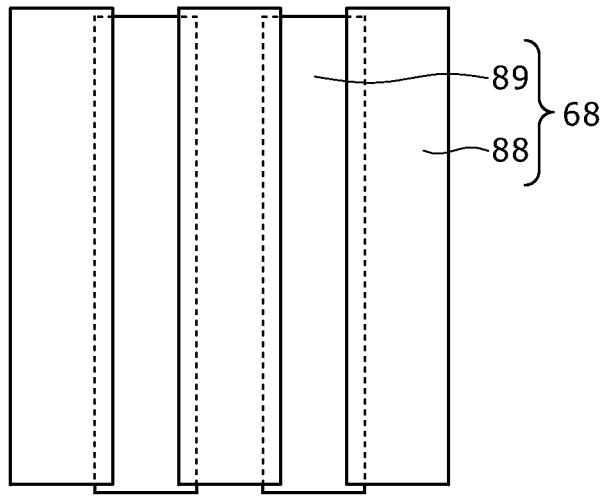

Various shapes are possible as the shapes of the light blocking component on the side of the first semiconductor chip section 22 and the light blocking component on the side of the second semiconductor chip section 26. FIGS. 19A to 19C show a modification example of the light blocking layer. A light blocking component 88 on the side of the first semiconductor chip section 22 is formed into a shape of plural strips that have a requisite width W1 and are arranged at a requisite interval t1 (see FIG. 19A). A light blocking component 89 on the side of the second semiconductor chip section 26 is formed into a shape of plural strips that have a requisite width W2 (>W1) larger than the above-described width W1 and are arranged at a requisite interval t2 (<t1) smaller than the above-described interval t1 (see FIG. 19B). The pitch of the strip part of the light blocking component 88 is set equal to that of the strip part of the light blocking component 89. The light blocking layer 68 is formed by overlapping the strip-manner light blocking component 88 and the strip-manner light blocking component 89 with each other in such a manner that the surface is uniformly covered in top view (see FIG. 19C). The solid-state imaging device having such a light blocking layer 68 also has the same advantageous effects as those described above.

3. Second Embodiment

Configuration Example of Solid-State Imaging Device

Figure 20:
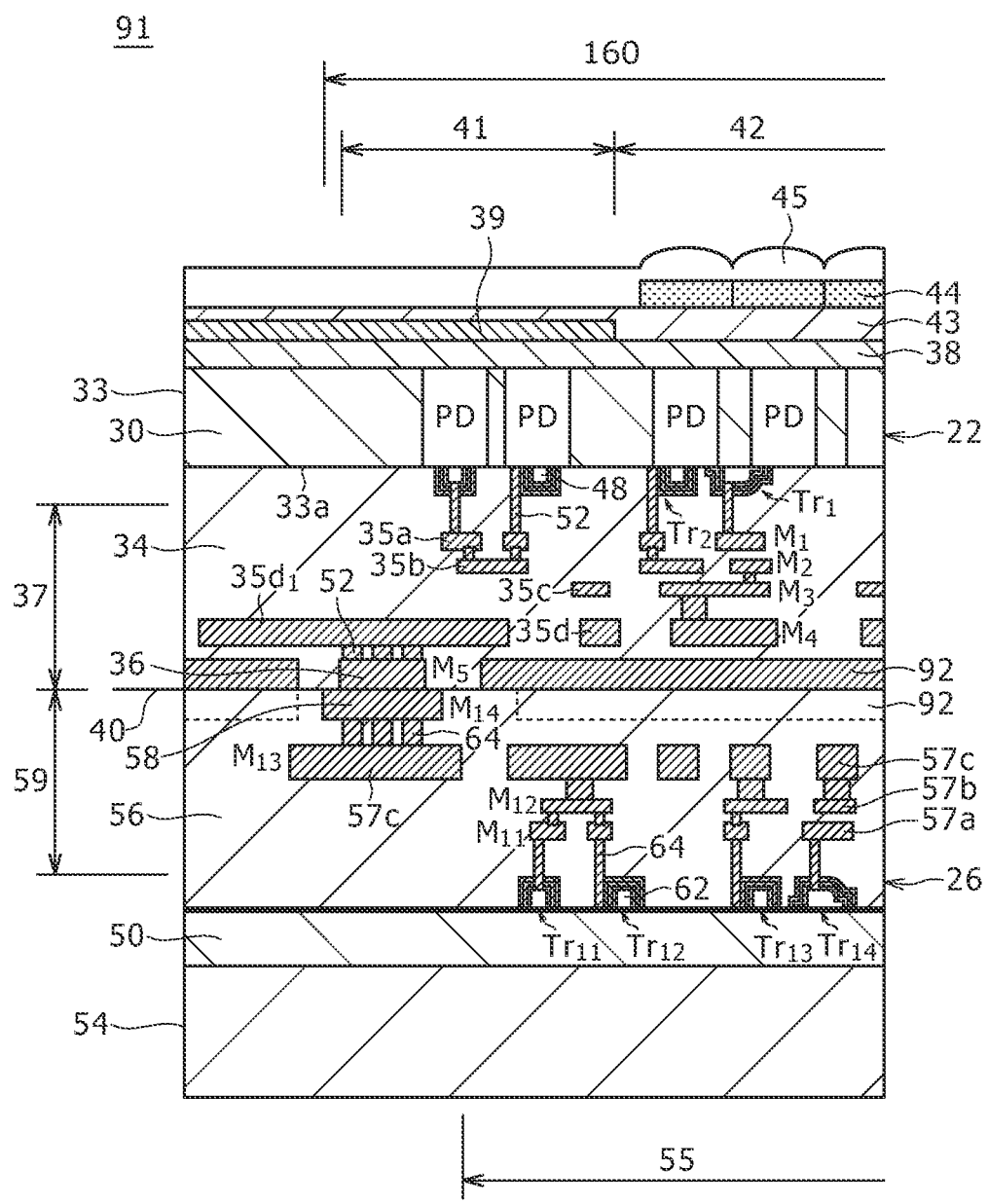
FIG. 20 is a schematic configuration diagram of a major part, showing a solid-state imaging device according to a second embodiment of the present disclosure.

FIG. 20 shows a solid-state imaging device according to another embodiment of the present disclosure, specifically a back-illuminated CMOS solid-state imaging device according to a second embodiment of the present disclosure. In a solid-state imaging device 91 according to the second embodiment, a light blocking layer 92 is formed on the side of the first semiconductor chip section 22 by the metal M5 of the same layer as that of the connecting interconnect 36. This light blocking layer 92 is formed uniformly over the whole surface. Even when a recess is generated due to dishing in chemical mechanical polishing (CMP) in the forming of the light blocking layer 92, which is uniform across the whole surface, bonding is enabled by increasing the pressure for tight adhesion.

The other configuration is the same as that of the first embodiment. Therefore, the same part as that in FIG. 3 is given the same symbol and overlapping description is omitted.

The light blocking layer 92, which is uniform across the whole surface, can be provided in either one or both of the first semiconductor chip section 22 and the second semiconductor chip section 26.

[Manufacturing Method Example of Solid-State Imaging Device]

The solid-state imaging device 91 according to the second embodiment can be manufactured based on the manufacturing method of the first embodiment except for that the pattern shape of the light blocking layer of the first embodiment is changed.

The solid-state imaging device 91 and the manufacturing method thereof according to the second embodiment have the same advantageous effects as those described for the first embodiment. Specifically, the light blocking layer 92 formed of the metal M5 or/and M14 of the same layer as that of the connecting interconnect 36 or/and 58 is formed near the bonding between the first semiconductor chip section 22 and the second semiconductor chip section 26. This light blocking layer 92 can suppress the incidence of emitted light due to hot carriers from the MOS transistor of the logic circuit 55 of the second semiconductor chip section 26 on the pixel array of the first semiconductor chip section 22. Therefore, the adverse effects of the light emission due to the hot carriers are suppressed and thus dark current and random noise can be suppressed.

Because the light blocking layer 92 is formed by the metal M5 or/and M14 of the same layer as that of the connecting interconnect 36 or/and 58, the thickness of the whole bonded semiconductor chip can be set smaller than that of the related-art example of FIG. 22 and the thickness of the solid-state imaging device 91 can be further reduced. This can provide a solid-state imaging device having less dark current and random noise without increasing the thickness of the whole semiconductor chip.

In the first semiconductor chip section 22, the interconnect 35d1 formed of the metal M4 connected to the connecting interconnect 36 via the electrically-conductive via 52 is so formed as to be extended to the side of the light blocking layer 92 and overlap with the light blocking layer 92. This can prevent emitted light from the second semiconductor chip section 26 from leaking to the pixel array through a gap.

In the manufacturing method, the interconnects, the connecting interconnects, and the light blocking layer can be simultaneously formed. Thus, reduction in the number of manufacturing steps, reduction in the mask step, and reduction in the material cost are achieved and a solid-state imaging device having less dark current and random noise can be manufactured at low cost. When the light blocking layer 92 is provided in the first semiconductor chip section 22 side, the via holes 80 can be easily formed because the aspect ratio of the via hole is lower than that in the related-art example of FIG. 22.

In the bonding between the first semiconductor substrate 33 and the second semiconductor substrate 54, so-called intermetallic bonding such as bonding between the connecting interconnects and bonding between the light blocking layers is obtained with a high area ratio. Therefore, high bonding strength is obtained and abnormalities due to film separation are suppressed. Thus, a solid-state imaging device can be manufactured at a high yield.

Metal layers having a large area, i.e. the connecting interconnects 36 and 58 and the light blocking layer 92, exist between the first and second semiconductor chip sections 22 and 26. Thus, heat radiation from the logic circuit 55 can be dispersed and the rise of the temperature on the pixel array side can be suppressed. Therefore, it is possible to provide a solid-state imaging device free from characteristic deterioration such as dark current of the pixel array when the operating temperature rises.

The above-described respective embodiments can also employ the configuration of FIG. 2C.

The above-described respective embodiments have the configuration in which two semiconductor chip sections 22 and 26 are bonded to each other. The solid-state imaging device according to one embodiment of the present disclosure can also have a configuration in which three or more semiconductor chip sections are bonded to each other. For example, it is also possible to configure the solid-state imaging device by three semiconductor chip sections, i.e. a third semiconductor chip section having a memory circuit in addition to the first semiconductor chip section having the pixel array and the second semiconductor chip section having the logic circuit. In this case, at least the configuration of the first and second semiconductor chip sections is a configuration including the above-described light blocking layer 68 or 92.

4. Third Embodiment

Configuration Example of Electronic Apparatus

The solid-state imaging devices according to the above-described embodiments of the present disclosure can be applied to electronic apparatus such as camera systems typified by digital cameras and video camcorders, cellular phones having an imaging function, and other pieces of apparatus having an imaging function.

Figure 21:
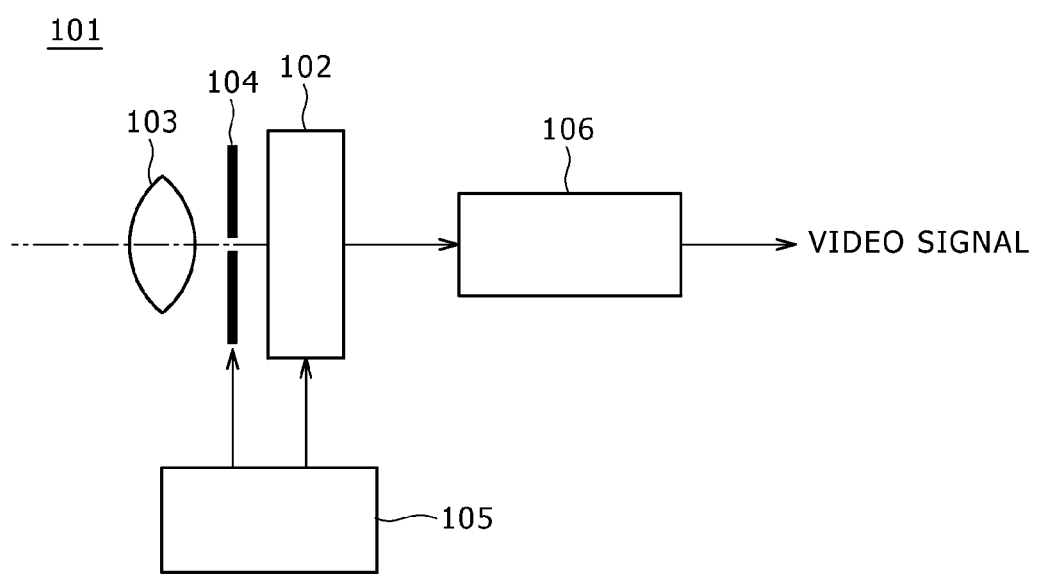
FIG. 21 is a schematic configuration diagram of an electronic apparatus according to a third embodiment of the present disclosure.

FIG. 21 shows a camera as one application example of electronic apparatus according to a third embodiment of the present disclosure. The camera according to the present embodiment is a video camcorder capable of photographing a still image or a moving image as an example. A camera 101 of the present embodiment has a solid-state imaging device 102, an optical system 103 that guides incident light to a light receiving sensor section of the solid-state imaging device 102, and a shutter device 104. Furthermore, the camera 101 has a drive circuit 105 that drives the solid-state imaging device 102 and a signal processing circuit 106 that processes an output signal of the solid-state imaging device 102.

As the solid-state imaging device 102, any of the solid-state imaging devices of the above-described respective embodiments is employed. The optical system (optical lens) 103 forms an image on the imaging plane of the solid-state imaging device 102 based on image light (incident light) from a subject. Thereby, a signal charge is accumulated in the solid-state imaging device 102 for a certain period. The optical system 103 may be an optical lens system composed of plural optical lenses. The shutter device 104 controls the period of light irradiation to the solid-state imaging device 102 and the period of light blocking. The drive circuit 105 supplies a drive signal to control the transfer operation of the solid-state imaging device 102 and the shutter operation of the shutter device 104. Signal transfer of the solid-state imaging device 102 is performed based on the drive signal (timing signal) supplied from the drive circuit 105. The signal processing circuit 106 executes various kinds of signal processing. A video signal resulting from the signal processing is stored in a storage medium such as a memory or output to a monitor.

The electronic apparatus according to the third embodiment includes the back-illuminated solid-state imaging device according to any of the above-described embodiments of the present disclosure. Thus, light emitted by hot carriers from the MOS transistor of the logic circuit is not incident on the pixel array side and dark current and random noise can be suppressed. Therefore, electronic apparatus with high image quality can be provided. For example, a camera with improved image quality and so forth can be provided.

[Configuration Example of Semiconductor Device]

The above-described light blocking layers 68 and 92 can be also applied to a semiconductor device obtained by bonding two semiconductor chip sections having a semiconductor integrated circuit to each other. For example, a first semiconductor chip section having a first logic circuit and a second semiconductor chip section having a second logic circuit are bonded to each other to configure a semiconductor device, although not shown in a diagram. Each of the first logic circuit and the second logic circuit is formed by plural MOS transistors. The first and second semiconductor chip sections each have a multilayer wiring layer and are so bonded that both multilayer wiring layers are opposed to each other. In this configuration, a light blocking layer is formed by metals of the same layers as those of interconnects of the multilayer wiring layers as described in the first and second embodiments, and the metals are brought into direct contact with and mechanically and electrically connected to each other.

According to this semiconductor device, light emitted by hot carriers from the MOS transistor of one logic circuit is blocked by the light blocking layer and the adverse effects on the other logic circuit can be suppressed.

A configuration having a light blocking layer similar to that of the above-described semiconductor device can be applied also to a semiconductor device obtained by bonding a first semiconductor chip section having a logic circuit and a second semiconductor chip section having a memory circuit to each other. Also in this semiconductor device, light emitted by hot carriers from the MOS transistor of the logic circuit is blocked by the light blocking layer and the adverse effects on the memory circuit can be suppressed.

The present disclosure contains subject matter related to that disclosed in Japanese Priority Patent Application JP 2011-024954 filed in the Japan Patent Office on Feb. 8, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a first semiconductor substrate including a pixel array and a first multilayer wiring layer having a first connecting interconnect, and a second semiconductor substrate including a logic circuit and a second multilayer wiring layer having a second connecting interconnect, wherein the first semiconductor substrate and the second semiconductor substrate are configured such that the first multilayer wiring layer and the second multilayer wiring layer are opposed to one another and are electrically connected to one another; and
   a light blocking layer including a first electrically-conductive film of the same layer as one of the first connecting interconnect and the second connecting interconnect formed uniformly across a whole surface between the first semiconductor substrate and the second semiconductor substrate corresponding to the logic circuit,
   wherein the solid-state imaging device is configured as a back-illuminated solid-state imaging device.

2. The solid-state imaging device according to claim 1, wherein the light blocking layer further comprises a second electrically-conductive film of the same layer as the other of the first connecting interconnect and the second connecting interconnect.

3. The solid-state imaging device according to claim 1, wherein the first multilayer wiring layer further comprises a first metal wiring, wherein the first metal wiring overlaps with the light blocking layer.

4. The solid-state imaging device according to claim 3, wherein the first multilayer wiring layer further comprises an electrically-conductive via between the first connecting interconnect and the first metal wiring.

5. The solid-state imaging device according to claim 1, wherein the first connecting interconnect and the second connecting interconnect are directly bonded to one another at a bonding portion.

6. The solid-state imaging device according to claim 1, wherein a material of the light blocking layer is selected from the group including Cu, Al, W, Ti, Ta, Mo, Ru, and alloys thereof.

7. The solid-state imaging device according to claim 1, wherein a film thickness of the light blocking layer is between 50 and 800 nm.

8. A method of manufacturing a solid-state imaging device, the method comprising:
   providing a first semiconductor substrate including a pixel array and a first multilayer wiring layer having a first connecting interconnect;
   providing a second semiconductor substrate including a logic circuit and a second multilayer wiring layer having a second connecting interconnect;
   forming a light blocking layer including a first electrically-conductive film of the same layer as one of the first connecting interconnect and the second connecting interconnect uniformly across a whole surface between the first semiconductor substrate and the second semiconductor substrate corresponding to the logic circuit; and
   arranging the first semiconductor substrate and the second semiconductor substrate such that the first wiring layer and the second multilayer wiring layer are opposed to one another and are electrically connected to one another,
   wherein the solid-state imaging device is configured as a back-illuminated solid-state imaging device.

9. The method of manufacturing a solid-state imaging device according to claim 8, wherein the light blocking layer further comprises a second electrically-conductive film of the same layer as the other of the first connecting interconnect and the second connecting interconnect.

10. The method of manufacturing a solid-state imaging device according to claim 8, further comprising:
    directly bonding the first connecting interconnect and the second connecting interconnect to one another at a bonding portion.

11. The method of manufacturing a solid-state imaging device according to claim 8, wherein the first multilayer wiring layer further comprises a first metal wiring, wherein the first metal wiring overlaps with the light blocking layer.

12. The method of manufacturing a solid-state imaging device according to claim 11, wherein the first multilayer wiring layer further comprises an electrically-conductive via between the first connecting interconnect and the first metal wiring.

13. An electronic apparatus comprising:
    a solid-state imaging device;
    an optical system configured to guide incident light to a photoelectric converter of the solid-state imaging device; and
    a signal processing circuit configured to process an output signal of the solid-state imaging device,
    wherein the solid state imaging device includes:
    a first semiconductor substrate including a pixel array and a first multilayer wiring layer having a first connecting interconnect, and a second semiconductor substrate including a logic circuit and a second multilayer wiring layer having a second connecting interconnect, wherein the first semiconductor substrate and the second semiconductor substrate are configured such that the first multilayer wiring layer and the second multilayer wiring layer are opposed to one another and are electrically connected to one another; and
    a light blocking layer including a first electrically-conductive film of the same layer as one of the first connecting interconnect and the second connecting interconnect formed uniformly across a whole surface between the first semiconductor substrate and the second semiconductor substrate corresponding to the logic circuit,
    wherein the solid-state imaging device is configured as a back-illuminated solid-state imaging device.

14. The electronic apparatus according to claim 13, wherein the light blocking layer further comprises a second electrically-conductive film of the same layer as the other of the first connecting interconnect and the second connecting interconnect.

15. The electronic apparatus according to claim 13, wherein the first multilayer wiring layer further comprises a first metal wiring, wherein the first metal wiring overlaps with the light blocking layer.

16. The electronic apparatus according to claim 15, wherein the first multilayer wiring layer further comprises an electrically-conductive via between the first connecting interconnect and the first metal wiring.

17. The electronic apparatus according to claim 13, wherein the first connecting interconnect and the second connecting interconnect are directly bonded to one another at a bonding portion.

18. The electronic apparatus according to claim 13, wherein a material of the light blocking layer is selected from the group including Cu, Al, W, Ti, Ta, Mo, Ru, and alloys thereof.

19. The electronic apparatus according to claim 13, wherein a film thickness of the light blocking layer is between 50 and 800 nm.

* * * * *